US010410998B2

(12) United States Patent
Kim et al.

(10) Patent No.: US 10,410,998 B2
(45) Date of Patent: Sep. 10, 2019

(54) MICRO-LED MODULE AND METHOD FOR FABRICATING THE SAME

(71) Applicant: LUMENS CO., LTD., Yongin-si, Gyeonggi-do (KR)

(72) Inventors: Daewon Kim, Yongin-si (KR); Eunsung Shin, Yongin-si (KR); Myungji Moon, Yongin-si (KR); Hanbeet Chang, Yongin-si (KR); Yongpil Kim, Yongin-si (KR); Jaesoon Park, Yongin-si (KR)

(73) Assignee: LUMENS CO., LTD., Yongin-si (KR)

( * ) Notice: Subject to any disclaimer, the term of this patent is extended or adjusted under 35 U.S.C. 154(b) by 0 days.

(21) Appl. No.: 15/814,157

(22) Filed: Nov. 15, 2017

(65) Prior Publication Data

US 2018/0182740 A1 Jun. 28, 2018

(30) Foreign Application Priority Data

Dec. 23, 2016 (KR) .................. 10-2016-0177568
Dec. 27, 2016 (KR) .................. 10-2016-0179732
(Continued)

(51) Int. Cl.
*H01L 25/075* (2006.01)
*H01L 27/15* (2006.01)
(Continued)

(52) U.S. Cl.
CPC .......... *H01L 25/0753* (2013.01); *H01L 25/50* (2013.01); *H01L 33/36* (2013.01);
(Continued)

(58) Field of Classification Search
CPC ......... H01L 33/62; H01L 33/54; H01L 33/36; H01L 33/08; H01L 25/0753; H01L 25/50;
(Continued)

(56) References Cited

U.S. PATENT DOCUMENTS

2004/0145270 A1* 7/2004 Haydock .................. H02K 3/46
  310/268
2006/0208273 A1 9/2006 Kang
(Continued)

FOREIGN PATENT DOCUMENTS

JP 63-78470 A 4/1988
JP 5-110241 A 4/1993
(Continued)

*Primary Examiner* — Galina G Yushina
(74) *Attorney, Agent, or Firm* — Mei & Mark LLP

(57) ABSTRACT

A micro-LED module is disclosed. The micro-LED module includes: a micro-LED including a plurality of LED cells, each of which includes a first conductive semiconductor layer, an active layer, and a second conductive semiconductor layer; a submount substrate mounted with the micro-LED; a plurality of electrode pads formed on the micro-LED cells; a plurality of electrodes formed corresponding to the plurality of electrode pads on the submount substrate; a plurality of connection members through which the plurality of electrode pads are connected to the corresponding plurality of electrodes; and a gap fill layer formed in the gap between the micro-LED and the submount substrate and having a bonding strength to the micro-LED and the submount substrate.

19 Claims, 17 Drawing Sheets

(30) Foreign Application Priority Data

Feb. 10, 2017 (KR) ........................ 10-2017-0018824
Feb. 10, 2017 (KR) ........................ 10-2017-0018842

(51) Int. Cl.
*H01L 33/00* (2010.01)
*H01L 25/00* (2006.01)
*H01L 33/36* (2010.01)
*H01L 33/54* (2010.01)
*H01L 33/62* (2010.01)

(52) U.S. Cl.
CPC ............ *H01L 33/54* (2013.01); *H01L 27/156* (2013.01); *H01L 33/0095* (2013.01); *H01L 33/62* (2013.01); *H01L 2933/005* (2013.01)

(58) Field of Classification Search
CPC ..... H01L 25/048; H01L 27/32; H01L 27/153; H01L 27/156
See application file for complete search history.

(56) References Cited

U.S. PATENT DOCUMENTS

| 2015/0200166 | A1* | 7/2015 | Kono | ..................... H01L 24/03 257/529 |
| 2015/0236214 | A1 | 8/2015 | Tischler et al. | |
| 2015/0340346 | A1 | 11/2015 | Chu et al. | |
| 2015/0362165 | A1* | 12/2015 | Chu | ..................... H01L 25/0753 362/235 |
| 2017/0365755 | A1* | 12/2017 | Chu | ..................... H01L 33/56 |

FOREIGN PATENT DOCUMENTS

| JP | 7-37911 A | 2/1995 |
| JP | 2012-504856 A | 2/2012 |
| JP | 2014-225586 A | 12/2014 |
| JP | 5008940 B2 | 9/2016 |
| KR | 10-0977260 B | 8/2010 |
| KR | 10-1259876 B | 4/2013 |

* cited by examiner (a)

A-A' section (b)

MICRO-LED MODULE AND METHOD FOR FABRICATING THE SAME

BACKGROUND OF THE INVENTION

1. Field of the Invention

The present invention relates to a micro-LED module including a micro-LED and a submount substrate mounted with the micro-LED. More specifically, the present invention relates to a micro-LED module in which the gap between a micro-LED and a submount substrate is prevented from becoming uneven from area to area so that connection members can be prevented from losing their function to connect electrode pads of the micro-LED to electrodes of the submount substrate, and a method for fabricating the micro-LED module.

2. Description of the Related Art

Displays using micro-LED modules are known. Each of the micro-LED modules is fabricated by flip-bonding a micro-LED including a plurality of LED cells to a submount substrate.

The micro-LED includes a light-transmitting sapphire substrate and a gallium nitride semiconductor light emitting unit formed on the light-transmitting sapphire substrate and having a plurality of LED cells. The semiconductor light emitting unit includes an exposed area of an n-type semiconductor layer formed by etching and the plurality of LED cells are arranged in a matrix on the exposed area of the n-type semiconductor layer. Each of the LED cells includes an n-type semiconductor layer, an active layer, and a p-type conductive semiconductor layer. A p-type electrode pad is disposed on the p-type conductive semiconductor layer of each LED cell. An n-type electrode pad is disposed on the exposed area of the n-type semiconductor layer.

The submount substrate includes a plurality of electrodes disposed corresponding to the electrode pads of the micro-LED. The micro-LED is flip-bonded to the mount substrate through solder bumps so that the electrode pads of the micro-LED are connected to the electrodes of the submount substrate. For flip-bonding of the micro-LED to the submount substrate, a solder constituting at least a portion of each solder bump should be heated to a temperature around its melting point. However, there are large differences in expansion and contraction strains between the Si-based submount substrate and the sapphire substrate upon heating and cooling during flip-bonding because the coefficient of thermal expansion of the Si-based submount substrate is significantly different from that of the sapphire substrate. These differences cause a serious misalignment between the submount substrate and the micro-LED.

Due to this misalignment, the electrode pads of the micro-LED are not connected to the electrodes of the submount substrate, and in a more severe case, the electrode pads of the micro-LED are misconnected to the electrodes of the submount substrate, causing serious detects, such as electrical shorting.

For example, the sapphire substrate on which the micro-LED is based has a coefficient of thermal expansion of 7.6 $\mu mm^{-1}K$, and the Si-based submount substrate has a coefficient of thermal expansion of 2.6 $\mu mm^{-1}K$. That is, the coefficient of thermal expansion of the sapphire substrate amounts to about 2.5 times that of the Si-based submount substrate. The coefficients of thermal expansion of the substrates depend on their temperature. The use of a high melting point solder for the bumps requires a high flip-bonding temperature. In this case, the large difference in coefficient of thermal expansion between the sapphire substrate and the submount substrate causes a misalignment between the micro-LED and the submount substrate, making it difficult to bond the micro-LED to the submount substrate. For example, when the melting point (260° C.) of the solder is set as a bonding temperature, an misalignment of 5 to 6 μm is caused per 1 cm of the substrates, making it substantially impossible to use the solder in a process where a bonding precision of 2 μm is required, like flip-bonding of the micro-LED.

Generally, a high-resolution display with a fine pixel pitch (≤10 μm) is manufactured by a flip-bonding process using a micro-LED, as described above. For a display with a lower precision of ≤2 μm, it is not easy to bond an LED substrate made of sapphire to a Si-based submount substrate due to their different coefficients of thermal expansion. The use of high melting point solder materials, such as Au or SnAg, is accompanied by heating to high temperature. This heating further increases the difference in strain resulting from different coefficients of thermal expansion of the LED substrate and the submount substrate, making it substantially impossible to bond the LED substrate to the submount substrate. Indium as a solder material with a relatively low melting point can be used for bonding but misalignment is inevitable.

Even when misalignment is reduced by decreasing the difference in strain caused by different coefficients of thermal expansion of an LED substrate and a submount substrate of a micro-LED, a slight gap may exist from area to area between the LED substrate and the submount substrate, resulting in loss of the function of connection members to connect electrode pads of the micro-LED to electrodes of the submount substrate. Particularly, the larger the difference in coefficient of thermal expansion between the LED substrate and the submount substrate, the more uneven the gap between the LED substrate and the submount substrate, making the above problem worse.

PRIOR ART DOCUMENTS

Patent Documents (Patent Document 1) Korean Patent No. 10-1150861 (issued on May 22, 2012)
(Patent Document 2) Korean Patent No. 10-0470904 (issued on Jan. 31, 2005)

SUMMARY OF THE INVENTION

It is one object of the present invention to provide a micro-LED module in which the gap between a micro-LED and a submount substrate is prevented from becoming uneven from area to area so that connection members can be prevented from losing their function to connect electrode pads of the micro-LED to electrodes of the submount substrate, and a method for fabricating the micro-LED module.

It is a further object of the present invention to provide a solution to the problem of misalignment between an LED substrate and a submount substrate due to their different coefficients of thermal expansion during mounting of a micro-LED.

A micro-LED module according to one aspect of the present invention includes: a micro-LED including a plurality of LED cells, each of which includes a first conductive semiconductor layer, an active layer, and a second conductive semiconductor layer; a submount substrate mounted with the micro-LED; a plurality of electrode pads formed on the micro-LED cells; a plurality of electrodes formed corresponding to the plurality of electrode pads on the submount substrate; a plurality of connection members through which the plurality of electrode pads are connected to the corresponding plurality of electrodes; and a gap fill layer formed in the gap between the micro-LED and the submount substrate and having a bonding strength to the micro-LED and the submount substrate.

According to one embodiment, the gap fill layer is formed by filling a gap filling material in the form of a liquid or gel between the micro-LED and the submount substrate and curing the gap filling material.

According to one embodiment, the gap fill layer is formed by filling a gap filling material in the form of a powder between the micro-LED and the submount substrate, melting the gap filling material, and curing the molten gap filling material.

According to one embodiment, the gap fill layer is formed between the micro-LED and the submount substrate to completely surround the plurality of connection members.

According to one embodiment, the plurality of LED cells are arrayed in a matrix inside the micro-LED and an exposed area of the first conductive semiconductor layer is formed outside the micro-LED.

According to one embodiment, the plurality of electrode pads include a plurality of individual electrode pads connected to the second conductive semiconductor layers of the plurality of LED cells and arrayed in a matrix and a peripheral common electrode pad connected to the first conductive semiconductor layer in the exposed area of the first conductive semiconductor layer; the plurality of electrodes include a plurality of first electrodes connected to the plurality of individual electrode pads and a second electrode connected to the common electrode pad; and the plurality of connection members include a plurality of inner connection members through which the plurality of individual electrode pads are connected to the plurality of first electrodes and a peripheral connection member through which the common electrode pad is connected to the second electrode.

According to one embodiment, the gap fill layer includes an inner filling portion occupying an inner area between the micro-LED and the submount substrate and surrounding the plurality of inner connection members and a peripheral filling portion occupying an outer area between the micro-LED and the submount substrate and surrounding the peripheral connection member.

According to one embodiment, the gap fill layer further includes a circumferential portion covering the peripheral sides of the micro-LED on a peripheral empty area of the submount substrate.

According to one embodiment, each of the plurality of connection members includes a solder that is melted and cured to electrically connect the plurality of electrode pads to the plurality of electrodes.

According to one embodiment, each of the plurality of connection members includes a metal pillar connected to one of the electrode pads and the electrodes and a solder formed on the metal pillar.

According to one embodiment, each of the plurality of connection members includes a conductive soft block disposed adjacent to one of the electrode pad and the electrode and a conductive insert rod inserted into and connected to the conductive soft block when a vertical force is applied thereto.

According to one embodiment, the gap fill layer may include an inner filling portion occupying an inner area between the micro-LED and the submount substrate where the plurality of micro-LED cells exist and a peripheral filling portion occupying a peripheral area between the micro-LED and the submount substrate where none of the plurality of micro-LED cells exist.

According to one embodiment, the gap fill layer may include a filling portion occupying an area between the micro-LED and the submount substrate and a circumferential portion covering the peripheral sides of the micro-LED on a peripheral empty area of the submount substrate. The term "filling portion" as used herein is intended to include the inner filling portion and the outer filling portion.

A method for fabricating a micro-LED module according to a further aspect of the present invention includes preparing a micro-LED provided with a plurality of electrode pads, preparing a submount substrate provided with a plurality of electrodes, mounting the micro-LED so as to face the submount substrate using a plurality of connection members connecting the plurality of electrode pads to the plurality of electrodes, and forming a gap fill layer having a bonding strength to the micro-LED and the submount substrate between the micro-LED and the submount substrate.

According to one embodiment, each of the plurality of connection members includes a solder that is melted and cured to electrically connect the plurality of electrode pads to the plurality of electrodes and the gap fill layer is formed by filling a gap filling material in the form of a liquid, gel or powder between the micro-LED and the submount substrate after melting and curing of the solder.

According to one embodiment, each of the plurality of connection members includes a solder that is melted and cured to electrically connect the plurality of electrode pads to the plurality of electrodes and the gap fill layer is formed by filling a gap filling material in the form of a liquid, gel or powder between the micro-LED and the submount substrate before melting of the solder.

According to one embodiment, the plurality of electrode pads include a plurality of individual electrode pads connected to second conductive semiconductor layers of the plurality of LED cells and arrayed in a matrix and a peripheral common electrode pad connected to the first conductive semiconductor layer in an exposed area of the first conductive semiconductor layer; the plurality of electrodes include a plurality of first electrodes connected to the plurality of individual electrode pads and a second electrode connected to the common electrode pad; and the plurality of connection members include a plurality of inner connection members through which the plurality of individual electrode pads are connected to the plurality of first electrodes and a peripheral connection member through which the common electrode pad is connected to the second electrode.

According to one embodiment, the micro-LED is mounted by connecting the electrode pads to the electrodes using the connection members including solders, and the submount substrate and an LED substrate of the micro-LED are controlled along different heating-cooling curves during melting of the solders by heating and curing of the solders by cooling.

According to the present invention, the formation of the gap fill layer having a predetermined bonding strength between the submount substrate and the LED substrate can prevent the gap between the LED substrate and the submount substrate from becoming uneven from area to area at least after the micro-LED is mounted on the submount substrate. This enables the plurality of connection members, such as solder bumps, to more reliably connect the electrode pads of the micro-LED and the electrodes of the submount substrate.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE INVENTION

Preferred embodiments of the present invention will now be described with reference to the accompanying drawings. It should be noted that the drawings and embodiments are simplified and illustrated such that those skilled in the art can readily understand the present invention, and therefore, they should not be construed as limiting the scope of the present invention.

First Embodiment

Figure 1:
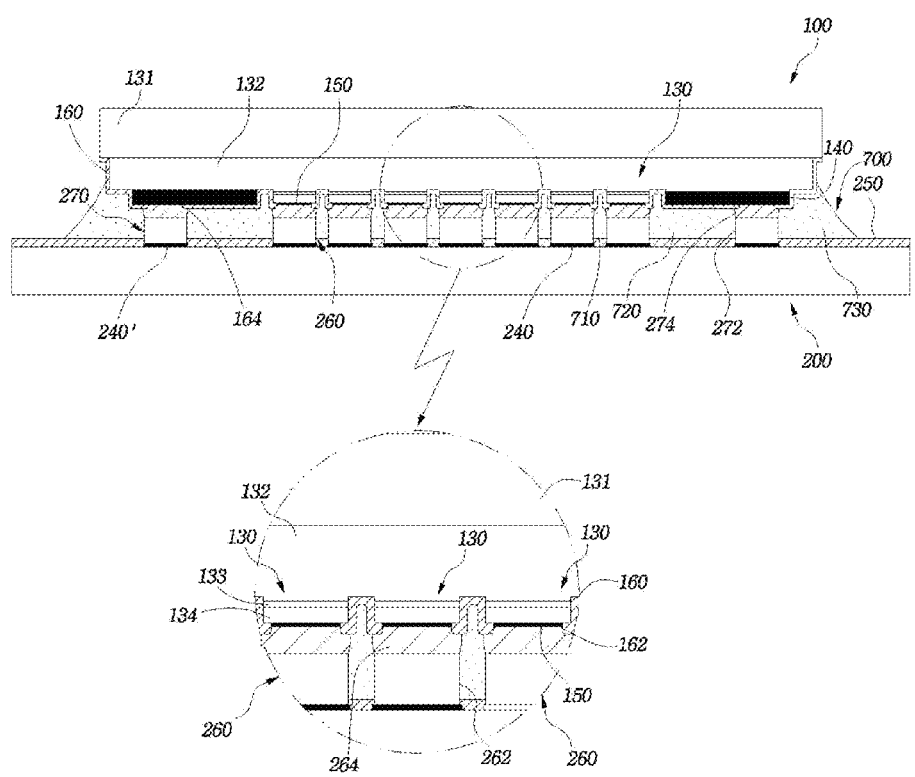
FIG. 1 illustrates a micro-LED module according to a first embodiment of the present invention.

Referring to FIG. 1, a micro-LED module according to a first embodiment of the present invention includes at least one micro-LED 100 including a plurality of LED cells 130 arrayed in a matrix and a submount substrate 200 mounted with the micro-LED 100. The micro-LED 100 includes at least one common electrode pad 140 disposed in an area corresponding to the peripheral edge thereof. A plurality of individual electrode pads 150 are disposed on the micro-LED 100 so as to correspond to the LED cells 130 arrayed in a matrix. The submount substrate 200 includes pad-type electrodes 240 and 240' formed corresponding to the common electrode pad 140 and the individual electrode pads 150, respectively. As used herein, the term "individual electrode pad" means an electrode pad individually connected to an n-type semiconductor layer or a p-type semiconductor layer provided in one LED cell. As used herein, the term "common electrode pad" means an electrode pad connected in common to n-type or p-type semiconductor layers of several LED cells.

In the micro-LED 100, an n-type semiconductor layer 132 is formed on the primary surface of a sapphire substrate 131 and the plurality of LED cells 130 are arrayed in a matrix on the n-type semiconductor layer 132. Each of the plurality of LED cells 130 includes an active layer 133 and a p-type semiconductor layer 134 grown sequentially in one direction from the n-type semiconductor layer 132. Due to this structure, an exposed area of the n-type semiconductor layer is formed at the periphery surrounding the circumferences of the LED cells 130 and trenches are formed between the adjacent LED cells 130 to expose the n-type semiconductor layer 132 therethrough. The micro-LED 100 includes an electrically insulating cell cover layer 160 covering the plurality of LED cells 130 and the exposed area of the n-type semiconductor layer 132. The cell cover layer 160 includes pad exposure holes through which the electrode pads 140 and 150 are exposed. The pad exposure holes include a plurality of first pad exposure holes through which the individual electrode pads 150 of the LED cells 130 are exposed and a second pad exposure hole through which the common electrode pad 140 is exposed.

The submount substrate 200 is preferably an active matrix substrate including a plurality of CMOS cells (not illustrated) corresponding to the plurality of LED cells 130 of the micro-LED 100 and pad-type electrodes 240 and 240' corresponding to the electrode pads of the micro-LED 100. In the submount substrate 200, an electrically insulating electrode cover layer 250 is formed to cover the electrodes 240 and 240' and includes electrode exposure holes through which the electrodes 240 and 240' are exposed.

The micro-LED module includes a plurality of connection members 270 and 260 through which the electrodes 240' and 240 of the submount substrate 200 are connected to the electrode pads 140 and 150 of the micro-LED 100, respectively.

Each of the plurality of connection members 270 and 260 includes a bump 270 or 260 connected to and vertically protruding from the corresponding electrode of the submount substrate 200.

The bumps 270 and 260 include Cu pillars 272 and 262 and solders 274 and 264 formed on top of the Cu pillars 272 and 262, respectively. The bumps 270 and 260 including the Cu pillars may also be replaced by bumps including other metal materials.

The solders 274 and 264 are made of SnAg as a solder material. The solders 274 and 264 maintain their original hemispherical shapes. When the solders 274 and 264 in a semi-molten state are inserted into the pad exposure holes and are then compressed, they are deformed in the pad exposure holes and are bonded to the electrode pads 140 and 150, respectively.

Since the solders 264 and 274 in a semi-molten state are partially inserted into the pad exposure holes and are then cured, they firmly fix the Cu pillars 262 and 272 to the electrode pads 150 and 140 at their accurate positions without sliding, respectively. After the compressive deformation, each of the cured solders 264 and 274 includes an inner solder portion inserted into the pad exposure hole and having the same diameter or the maximum width as that of the pad exposure hole and an outer solder portion in contact with the surface of the cell cover layer 160 around the pad exposure hole. Thus, the pad exposure holes permit partial insertion of the solders in a semi-molten state and serve as solder insert holes that are tightly engaged with the solders to firmly fix the solders when the semi-molten solders are cured.

Since the LED substrate 131 of the micro-LED 100 is a sapphire substrate 131 having a coefficient of thermal expansion of 7.6 $\mu mm^{-1}K$ and the submount substrate 200 is a Si-based submount substrate having a coefficient of thermal expansion of 2.6 $\mu mm^{-1}K$, there may be a difference in strain caused by the difference in coefficient of thermal expansion between the micro-LED 100 and the submount substrate 200 during heating and cooling of the solders for flip-bonding of the micro-LED 100 to the submount substrate 200. This strain is preferably suppressed by a flip-bonding method in which the temperatures of the substrate 131 and the submount substrate 200 are controlled along different heating-cooling curves.

The micro-LED module includes a gap fill layer 700 formed between the micro-LED 100 and the submount substrate 200. For example, the gap fill layer 700 may be formed using an insulating adhesive material, such as an epoxy or silicone adhesive. The formation of the gap fill layer 700 prevents the gap between the micro-LED 100 and the submount substrate 200 from becoming uneven from area to area at least after the micro-LED 100 is mounted on the submount substrate 200 so that the connection members 260 and 270 can be prevented from losing their function to connect the electrode pads of the micro-LED 100 to the electrodes of the submount substrate.

The gap fill layer 700 is formed to fill the gap between the micro-LED 100 and the submount substrate 200 and completely surrounds the sides of the connection members 260 connecting the electrode pads 150 to the electrodes 240 and the sides of the connection member 270 connecting the electrode pad 140 to the electrode 240'. The gap fill layer 700 includes an inner filling portion 710 and a peripheral filling portion 720. The inner filling portion 710 surrounds the inner connection members 260 connecting the individual electrode pads 150 to the individual electrodes 240 and the peripheral filling portion 720 surrounds the peripheral connection member 270 connecting the common electrode pad 140 to the common electrode pad 240' in the exposed area of the n-type semiconductor layer on which the common electrode pad 140 is disposed.

The submount substrate 200 includes an empty area at the periphery of the area mounted with the micro-LED 100. Preferably, the gap fill layer 700 further includes a circumferential portion 730 covering the peripheral sides of the micro-LED 100 on the peripheral empty area of the submount substrate 200.

The gap fill layer 700 is formed using an adhesive material, such as an epoxy or silicone adhesive, and firmly fixes the submount substrate 200 to the LED substrate 131. For this reason, the connection members (that is, the solders of the bumps) connecting the electrode pads to the electrodes are protected from damage caused by an uneven gap between the submount substrate 200 and the LED substrate 131 from area to area. Furthermore, the amount of the filling material filled can be adjusted from area to area such that the bonding strengths of the peripheral filling portion 720 and the circumferential portion 730 are greater than the bonding strength of the inner filling portion 710.

For example, since the LED substrate is relatively frequently detached from the mount substrate at the peripheral side, an increase in the amount of the filling material filled at the peripheral side leads to a further increase in bonding strength.

The construction of the micro-LED and the mounting of the micro-LED on the submount substrate will be explained sequentially below.

Construction of Micro-LED

With reference to FIGS. 2a to 2e, an explanation will be given concerning a process for constructing a micro-LED.

Figure 2A:
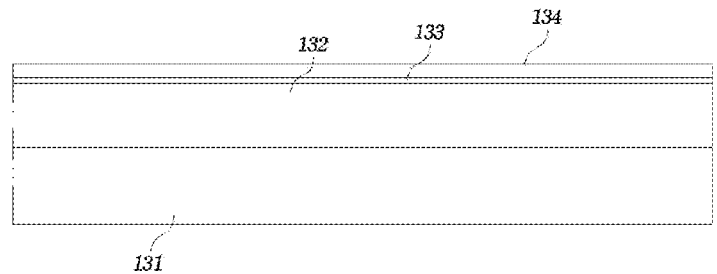
FIGS. 2a to 2e illustrate a process for constructing a micro-LED in a method for fabricating a micro-LED module according to a first embodiment of the present invention.

First, an epilayer including an n-type semiconductor layer 132, an active layer 133, and a p-type semiconductor layer 134 is formed on the primary surface of a light-transmitting sapphire substrate 131, as illustrated in FIG. 2a. The light-transmitting sapphire substrate 131 has a coefficient of thermal expansion of 7.6 $\mu mm^{-1}K$.

Figure 2B:
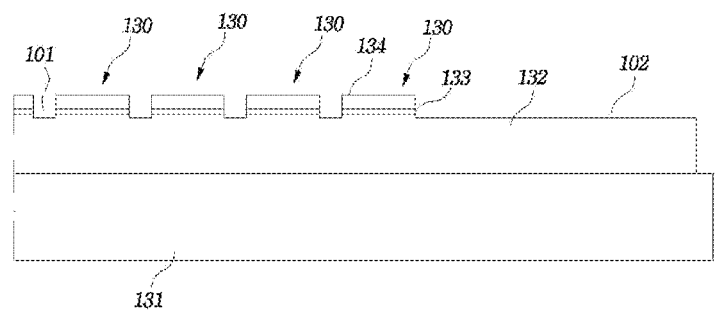
Figure 2C:
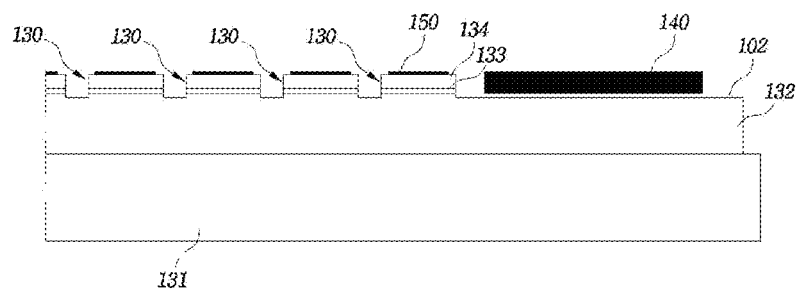

Next, the epilayer is etched to a predetermined depth using a mask pattern to form trenches 101 and an exposed area 102 of the n-type semiconductor layer 132, as illustrated in FIG. 2b. As a result of this etching, a plurality of LED cells 130 are formed. The plurality of LED cells 130 are separated by the trenches 101 and are surrounded by the exposed area 102 of the n-type semiconductor layer 132. Each of the LED cells 130 has a structure in which the active layer 133 and the p-type semiconductor layer 134 are formed on the n-type semiconductor layer 132. Although not illustrated, a buffer layer may be formed between the n-type semiconductor layer 132 and the sapphire substrate 131. Other semiconductor layers having specific functions may be interposed between the n-type semiconductor layer 132 and the active layer 133, between the active layer 133 and the p-type semiconductor layer 134, and on the exposed surface of the p-type semiconductor layer 134.

Next, a p-type individual electrode pad 150 is formed on each of the p-type semiconductor layers 134 of the LED cells 130 and an n-type common electrode pad 140 is formed at the periphery of the exposed area 102 of the n-type semiconductor layer 132, as illustrated in FIG. 1c. The p-type individual electrode pad 150 and the n-type common electrode pad 140 are designed to have different thicknesses. This design compensates for the step height between the p-type semiconductor layer 134 and the n-type semiconductor layer 132.

Figure 2D:
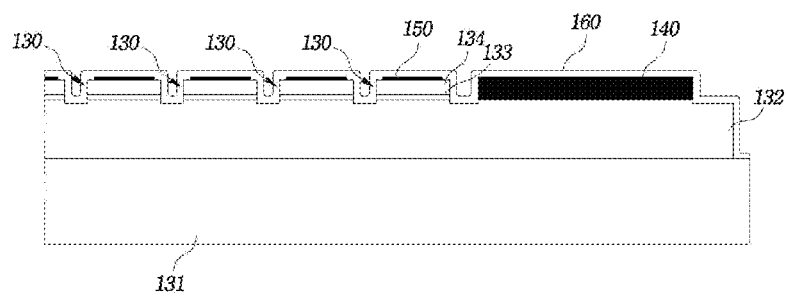

Next, an electrically insulating cell cover layer 160 is formed so as to cover the LED cells 130 and the exposed area 102 of the n-type semiconductor layer 132, as illustrated in FIG. 2d.

Figure 2E:
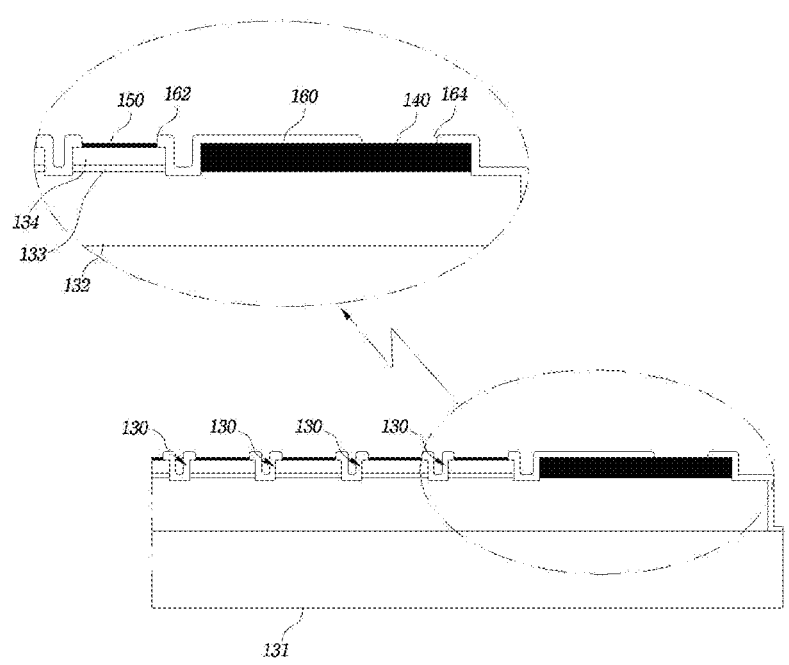

Next, first pad exposure holes 162 through which the p-type electrode pads 150 are exposed and a second pad exposure hole 164 through which the n-type electrode pad 140 is exposed are formed, as illustrated in FIG. 2e. The first pad exposure holes 162 and the second pad exposure hole 164 may be formed by etching using a mask pattern. The cell cover layer 160 is formed to substantially the same thickness along the cross-sectional profile of the LED cells 130 such that the width and depth of the trenches 101 between the neighboring LED cells 130 decrease but the trenches remain unremoved. Alternatively, the cell cover layer 160 may completely fill the trenches 101.

Preferably, the LED cells 130 of the constructed micro-LED 100 have a size of 5 μm or less and thus the p-type individual electrode pads 150 formed in the LED cells 130 have a size smaller than 5 μm.

[Preparation of Submount Substrate and Formation of Bumps]

Figure 3:
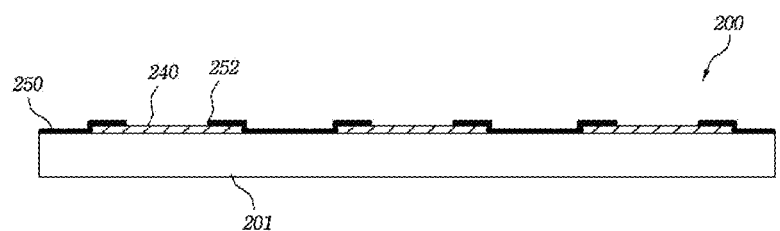
FIGS. 3 and 4 illustrate a process for forming bumps on a submount substrate in a method for fabricating a micro-LED module according to a first embodiment of the present invention.

Referring first to FIG. 3, a Si-based submount substrate 200 having a size of about 15,000 μm×10,000 μm is prepared, followed by the formation of pillar bumps. The submount substrate 200 may include a plurality of CMOS cells corresponding to the plurality of LED cells, a plurality of individual electrodes 240 corresponding to the p-type electrode pads of the micro-LED, and a common electrode (not illustrated) corresponding to the n-type electrode pad of the micro-LED. The plurality of electrodes 240 of the submount substrate 200 are arranged in a matrix on a Si-based substrate material 201 and are connected to the CMOS cells. An electrically insulating electrode cover layer 250 is formed so as to cover the electrodes 240. The electrode cover layer 250 has electrode exposure holes 252 through which the individual electrodes 240 are exposed.

Bumps are formed by a process including the following steps: first scrubbing, under bump metallurgy (UBM) formation, photolithography, scum removal, Cu plating, solder metal plating, PR stripping, UBM etching, second scrubbing, reflow, and third scrubbing.

Figure 4:
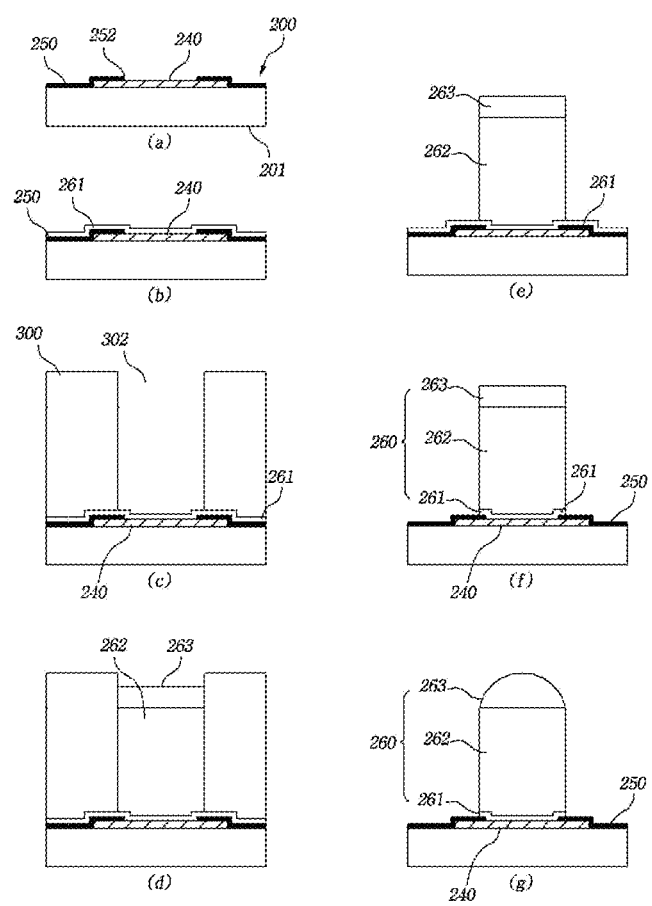

In the first scrubbing step, a submount substrate 200 is scrubbed with a scrubber, as illustrated in (a) of FIG. 4. In the submount substrate 200, a pad-type electrode 240 made of an Al or Cu material is formed on a substrate material 201 including CMOS cells and an electrode cover layer 250 having an electrode exposure hole 252 is formed on the substrate material 201. The CMOS cells are formed by a CMOS process and one area of the electrode 240 is exposed through the electrode exposure hole 252.

In the UBM formation step, a UBM 261 is formed on the submount substrate 200 to cover the electrode cover layer 250 and the electrode 240, as illustrated in (b) of FIG. 4. The UBM 261 serves to increase the adhesion of the electrode 240 to a Cu pillar and to prevent a solder from diffusing. The UBM 261 may have a layered structure of Ti/Cu and may be formed by sputtering the corresponding metals. It is noted that the UBM 261 may be a part of the electrode 240 in a broad sense.

In the photolithography step, a photoresist (PR) 300 is formed over the entire area of the UBM 261 on the submount substrate 200, as illustrated in (c) of FIG. 4. Thereafter, a mask pattern (not illustrated) is placed on the photoresist and light is applied to form an electrode exposure hole 302 through which only one area of the UBM 261 formed directly on the electrode 240 is exposed. Next, scum formed during the photolithography is removed.

Next, Cu is plated through the opening 302 of the PR 300 to form a Cu pillar 262 and then SnAg as a solder metal is plated on the Cu pillar 262 to form a SnAg solder 263 in the form of a layer with a predetermined thickness, as illustrated in (d) of FIG. 4. It is noted herein that Cu may be Cu metal or its alloy.

Next, the PR is stripped. As a result, the upper and side surfaces of a bump including the Cu pillar 262 and the solder 263 are exposed, as illustrated in (e) of FIG. 4.

Next, UBM etching is performed such that only the portion of the UBM 261 located directly under the Cu pillar 262 remains unremoved and the other portions of the UBM 261 are removed by etching, as illustrated in (f) of FIG. 4. Then, second scrubbing is carried out to remove residue. After the UBM etching, the resulting bump 260 has a structure in which the Cu pillar 262 and the solder cap 263 are sequentially stacked on the UBM 261 formed on the electrode 240 of the submount substrate 200. Next, reflow is performed. As a result, the solder 263 in the form of a layer is melted and cured to form a hemisphere. Alternatively, the solder 263 may have a shape whose cross-section is semi-circular. Rapid thermal processing (RTP) is suitable for this reflow. Next, third scrubbing is performed to remove residue.

Preferably, the interval between the adjacent Cu pillar bumps 260 on the submount substrate 200 is substantially the same as the diameter of the Cu pillar 262. It is desirable that the interval between the adjacent Cu pillar bumps 260 does not exceed 5 μm. If the interval exceeds 5 μm, the diameter of the Cu pillar bumps 260 and the size of the LED cells corresponding thereto increase, resulting in a deterioration in the precision of a display including the micro-LED.

Mounting

Referring to FIGS. 5a, 5b, and 5c, the micro-LED 100 based on the sapphire substrate 131 is flip-bonded to the submount substrate 200 based on the Si substrate material. The Si substrate material has a coefficient of thermal expansion of 2.6 μmm$^{-1}$K and the sapphire substrate 131 has a coefficient of thermal expansion of 7.6 μmm$^{-1}$K, which is about 2.5-fold higher than that of the Si substrate material.

As mentioned earlier, the plurality of electrodes of the submount substrate 200 are disposed corresponding to the electrode pads 150 of the micro-LED 100. The bumps 260 are formed on the plurality of electrodes. Each of the bumps 260 consists of the Cu pillar 262 and the SnAg solder 263.

The micro-LED 100 is flip-bonded to the submount substrate 200 through the bumps so that the electrode pads 150 of the micro-LED 100 are connected to the electrodes of the submount substrate 200.

For flip-bonding of the micro-LED 100 to the submount substrate 200, a solder constituting at least a portion of each solder bump 260 should be heated to a temperature around its melting point. However, in the case where a conventional flip-bonding process is performed without controlling the temperatures of the micro-LED 100 and the submount substrate 200, a difference in strain between the Si-based submount substrate 200 and the sapphire substrate 131 is observed because the coefficient of thermal expansion of the Si-based submount substrate 200 is significantly different from that of the sapphire substrate 131 of the micro-LED 100, leading to a severe misalignment between the submount substrate 200 and the micro-LED 100 flip-bonded thereto.

For instance, when it is desired to flip-bond the micro-LED 100 based on the 1-cm long sapphire substrate 131 to the 1-cm long Si-based submount substrate 200 at 250° C. at which the solders are melted, the submount substrate 200 is lengthened by 5.85 μm due to the coefficient of thermal expansion of Si and the sapphire substrate 131 of the micro-LED 100 is lengthened by 17.1 μm due to the coefficient of thermal expansion of sapphire. That is, the difference in length between the two substrates is 11.25 μm during bonding. As a consequence, this length difference causes a severe cell misalignment.

In an attempt to solve the problem of cell misalignment, the present invention takes into consideration the coefficient of thermal expansion of the Si-based submount substrate 200 including a drive IC and a circuit and the coefficient of thermal expansion of the sapphire substrate 131. Based on this consideration, the micro-LED 100 is flip-bonded to the submount substrate 200 by heating the solders 263 between the micro-LED 100 and the submount substrate 200, more specifically, the solder 263 of the bumps 260 interposed between the electrode pads 150 formed on the LED cells 130 of the micro-LED 100 and the submount substrate 200 while controlling the temperatures of the Si-based sapphire substrate 200 and the sapphire substrate 131 to different values.

The temperature of the sapphire substrate 131 is controlled by a first temperature control unit 5b mounted on a first chuck 5a in face-to-face contact with the sapphire substrate 131 to support the micro-LED 100 and the temperature of the Si-based submount substrate 200 is controlled by a second temperature control unit 6b mounted on a second chuck 6a to support the submount substrate 200.

Figure 6:
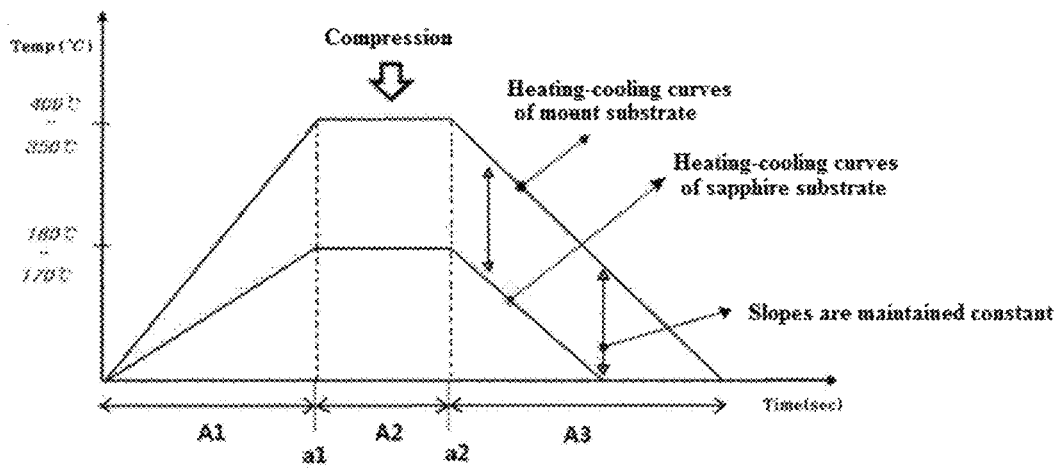
FIG. 6 shows heating-cooling curves of a micro-LED and a submount substrate during mounting of the micro-LED on the submount substrate in a method for fabricating a micro-LED module according to a first embodiment of the present invention.

The temperatures of the submount substrate 200 and the sapphire substrate 131 of the micro-LED 100 are controlled to different values in a heating zone A1, a holding zone A2, and a cooling zone A3 during flip-bonding, as best illustrated in FIG. 6.

In the heating zone A1, the temperature of the sapphire substrate 131 is allowed to rise linearly along a first heating curve from room temperature to a first holding temperature (~170-180° C.) by the first temperature control unit 5b mounted on the first chuck 5a and the temperature of the Si-based submount substrate 200 is allowed to rise linearly along a second heating curve from room temperature to a second holding temperature (~350-400° C.) by the second temperature control unit 6b mounted on the second chuck 6a.

In the heating zone A2, a force is applied to vertically compress the submount substrate 200 and the micro-LED 100 between which the molten solder 264 in a molten state is disposed. The temperature of the sapphire substrate 131 is maintained at the first holding temperature of 170-180° C. for a constant time and the temperature of the Si-based submount substrate 200 is maintained at the second holding temperature (350-400° C.) for the indicated time.

In the holding zone, the sapphire substrate 131 and the submount substrate 200 begin to maintain their temperatures at the same point a1 and finish to maintain their temperatures at the same point a2.

In the cooling zone A3, the sapphire substrate 131 is cooled from the first holding temperature to room temperature and the Si-based submount substrate 200 is cooled from the second holding temperature to room temperature. In the cooling zone A3, it is preferred that the cooling curve of the sapphire substrate 131 is the same as that of the Si-based submount substrate 200. Thus, in the cooling zone, the time when the cooling of the light-transmitting sapphire substrate 131 to room temperature is completed is earlier than the time when the cooling of the submount substrate 200 to room temperature is completed.

If the cooling curve of the sapphire substrate 131 is made excessively different from that of the submount substrate 200 in order to complete the cooling of the sapphire substrate 131 and the submount substrate 200 at the same time point, a significant difference in shrinkage strain between the sapphire substrate 131 and the submount substrate 200 is observed, and as a result, the solder connections are cut and the LED cells are misaligned.

Referring again to FIG. 5, for flip-bonding, the submount substrate 200 is arranged to face the micro-LED 100 ((a) of FIG. 5). Thus, the plurality of bumps 260 formed on the submount substrate 200 are also arranged to face the plurality of p-type electrode pads 150 formed on the micro-LED 100. Although not illustrated, the n-type electrode pad is also arranged to face the corresponding bumps.

Each of the plurality of p-type electrode pads 150 is exposed through the pad exposure hole (or the solder insert hole 162) formed in the cell cover layer 160 as a passivation layer and is depressed to a predetermined depth from the surface of the cell cover layer 160.

When the diameter or maximum width of each of the pad exposure holes 162 is defined as c, the distance between the two pad exposure holes 162 adjacent to the corresponding pad exposure hole 162 is defined as a, and the diameter or maximum width of the corresponding Cu pillar 262 is defined as C, c, a, and C increase in the order c<C'<a.

Each of the solders 264 is in the form of a hemisphere before insertion into the corresponding pad exposure hole 162, that is, before compressive deformation. The diameter or maximum width of the base portion of the solder in contact with the top end of the Cu pillar 262 is determined to be substantially the same as the diameter or maximum width C' of the Cu pillar 262. When the maximum width of each of the LED cells 130 on which the cell cover layer 160 is formed is defined as b, c, C', b, and a increase in the order c<C'<b<a.

If the diameter or maximum width C' of the Cu pillar 262 is smaller than the diameter or maximum width c of the pad exposure holes 162, the function of the pad exposure hole 162 cannot be expected, making it difficult for the solder cap in a semi-molten state to slide on the p-type electrode pad 150 and be bonded to the desired position. If the diameter or maximum width C' of the Cu pillar 262 is larger than the distance a between the two pad exposure holes 162 adjacent to the corresponding pad exposure hole 162, the solder 264 may reach not only the corresponding pad exposure hole but also the adjacent pad exposure holes, causing shorting.

The depth h of the pad exposure hole 162, the thickness T of the passivation layer, and the thickness t of the p-type electrode pad 150 satisfy the relations given by h=T−t and T>t.

Figure 5:
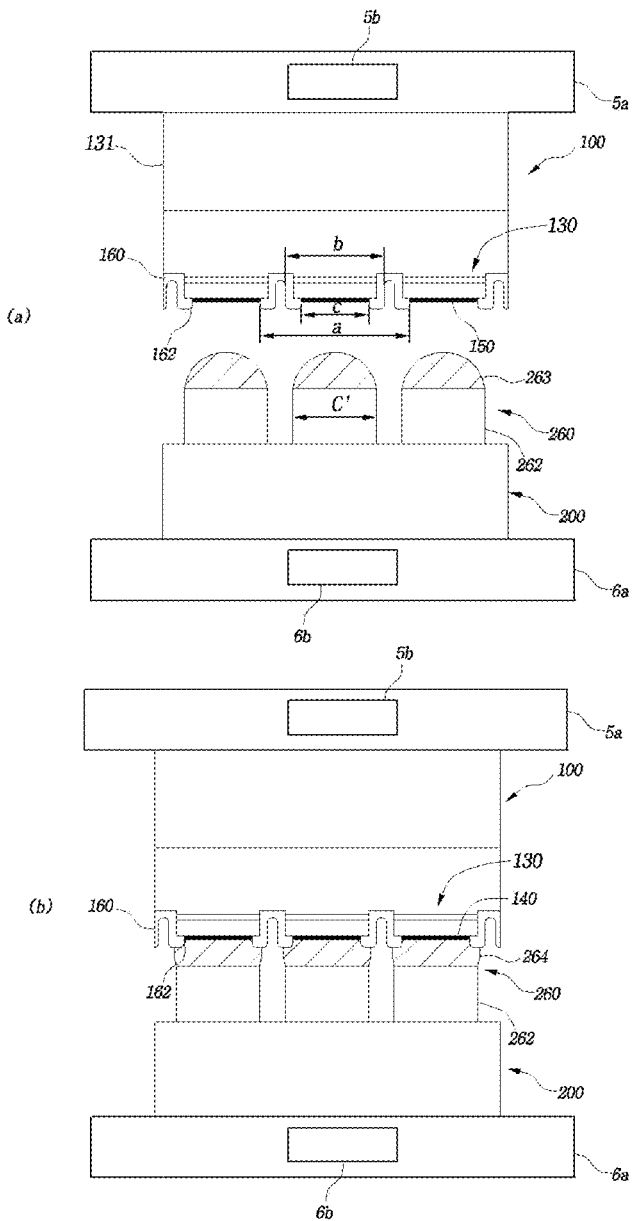
FIG. 5 illustrates a process for mounting a micro-LED on a submount substrate in a method for fabricating a micro-LED module according to a first embodiment of the present invention.

After the solder cap 264 disposed at the end of the Cu pillar 262 of the Cu pillar bump 260 is semi-melted by heating above a predetermined temperature, the solder 264 is inserted into the pad exposure hole 162 and is subsequently compressed by reducing the distance between the Cu pillar 262 and the electrode pad 150, as illustrated in (b) of FIG. 5. The front portion of the solder 264 is deformed by compression and fills the pad exposure hole 162. The rear portion of the solder 264 is brought into contact with the outer surface of the cell cover layer 160 outside the pad exposure hole 162.

Finally, the solder 264 is cured after deformation and is embedded in the pad exposure hole 162. Here, the minimum width of the solder 264 is the same as the diameter or maximum width of the pad exposure hole 162 and the maximum width of the solder 264 is larger than the maximum width or diameter of the pad exposure hole 162 and is smaller than the width of the LED cell 130.

Formation of Gap Fill Layer

Figure 7:
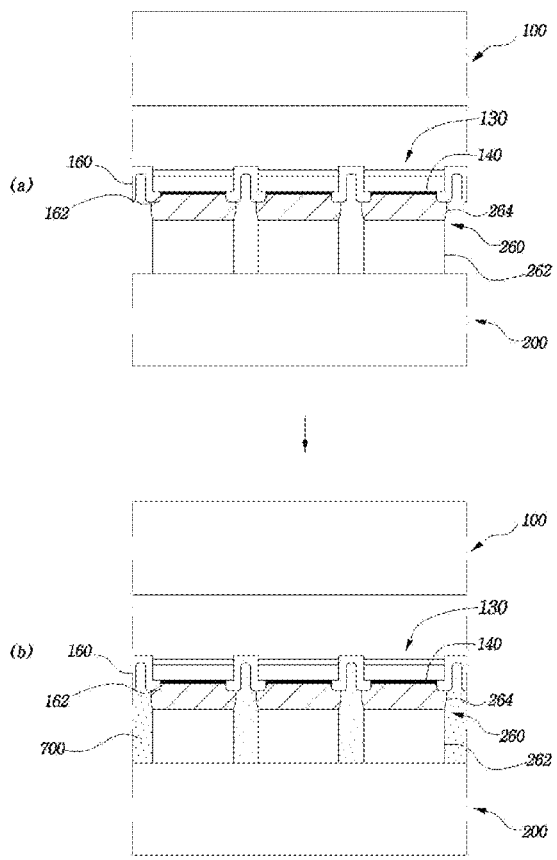
FIG. 7 illustrates the formation of a gap fill layer after mounting of a micro-LED on a submount substrate in a method for fabricating a micro-LED module according to a first embodiment of the present invention.

Next, a gap fill layer 700 is formed between the micro-LED 100 and the submount substrate 200, as illustrated in FIG. 7. The gap fill layer 700 is formed by filling an adhesive material, such as an epoxy or silicon adhesive, between the micro-LED 100 and the submount substrate 200 and curing the adhesive material. A larger amount of the gap filling material may be filled in an area, for example, an edge area, where the gap size is anticipated to change in response to time and temperature variations.

Figure 8:
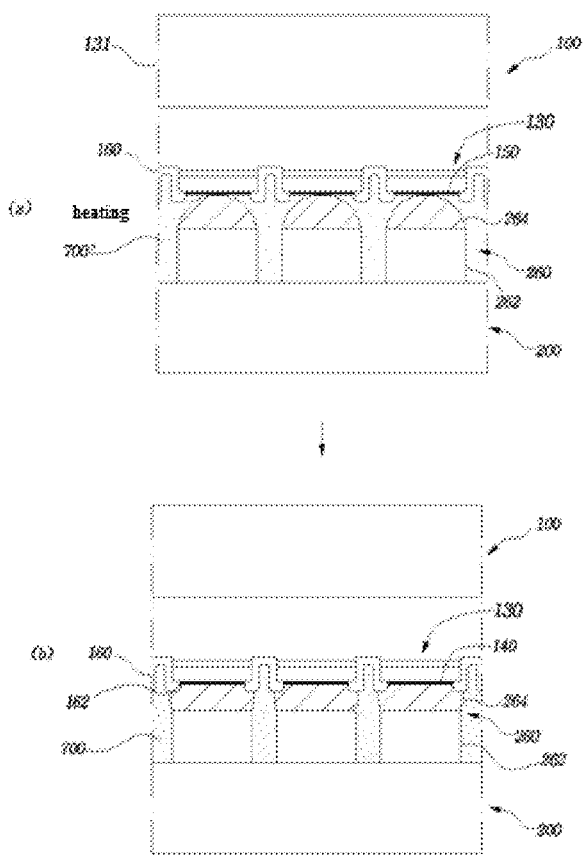
FIG. 8 illustrates the formation of a gap fill layer before mounting of a micro-LED on a submount substrate in accordance with an alternative method for fabricating a micro-LED module according to a first embodiment of the present invention.

FIG. 8 illustrates the formation of a gap fill layer before mounting by a process different from the process illustrated in FIG. 7.

As illustrated in FIG. 8, the electrode pads 150 of the micro-LED 100 is brought into face-to-face contact with the bumps 260 of the submount substrate 200. To this end, before or after placing of the micro-LED 100, an insulating adhesive gap filling material 700' in the form of a powder, liquid or gel is filled in the gap between the micro-LED 100 and the submount substrate 200 and the micro-LED 100 is then flip-bonded to the submount substrate 200 by heating the solders 264 of the bumps 260. In this case, even during heating and cooling for the flip-bonding, the gap filling material 700' or the gap fill layer 700 formed by melting and curing the gap filling material 700' holds the micro-LED 100 and the submount substrate 200 having different coefficients of thermal expansion by an adhesive force above a predetermined level, contributing to the prevention of deformation caused by excessively different coefficients of thermal expansion of the micro-LED 100 and the submount substrate 200.

Figure 9:
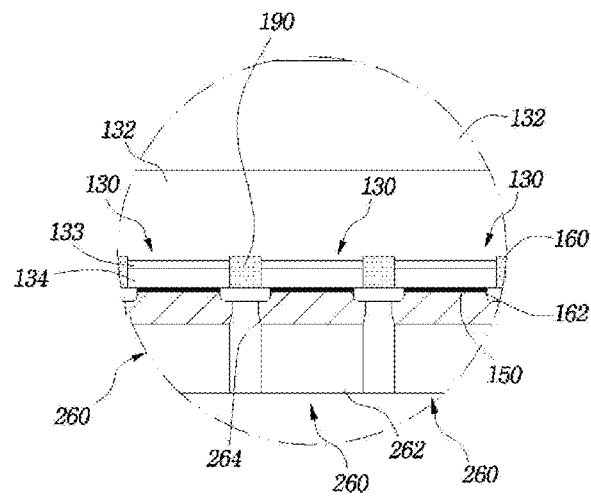
FIG. 9 illustrates a modification of a micro-LED module according to a first embodiment of the present invention in which a filler is filled between LED cells.

A modification of the micro-LED module is illustrated in FIG. 9. Referring to FIG. 9, the modified micro-LED module may further include a filler 190 filled between the individual LED cells 130. The filler may be, for example, $SiO_2$, $Si_3N_4$, a combination of $SiO_2$ and $Si_3N_4$, or polyamide. The filling of the filler 190 between the individual LED cells 130 can be accomplished by plasma-enhanced chemical vapor deposition (PECVD), evaporation or sputtering. The filler 190 ensures the insulation of the plurality of LED cells 130 and is effective in thermally stabilizing the LED cells 130 when high-temperature work is needed during subsequent processing. The filler 190 serves to reduce the fresnel of light from the plurality of LED cells because of its higher refractive index than air. The filler 190 may be filled between the plurality of LED cells 130 after or before formation of the cell cover layer 160. Further, a portion of the filler may cover the electrode pads of the LED cells. In this case, the filler may also be used as a portion of the cell cover layer 160. The filler 190 may be filled to the same height as the height of the protruding LED cells 130.

Second Embodiment

Figure 10:
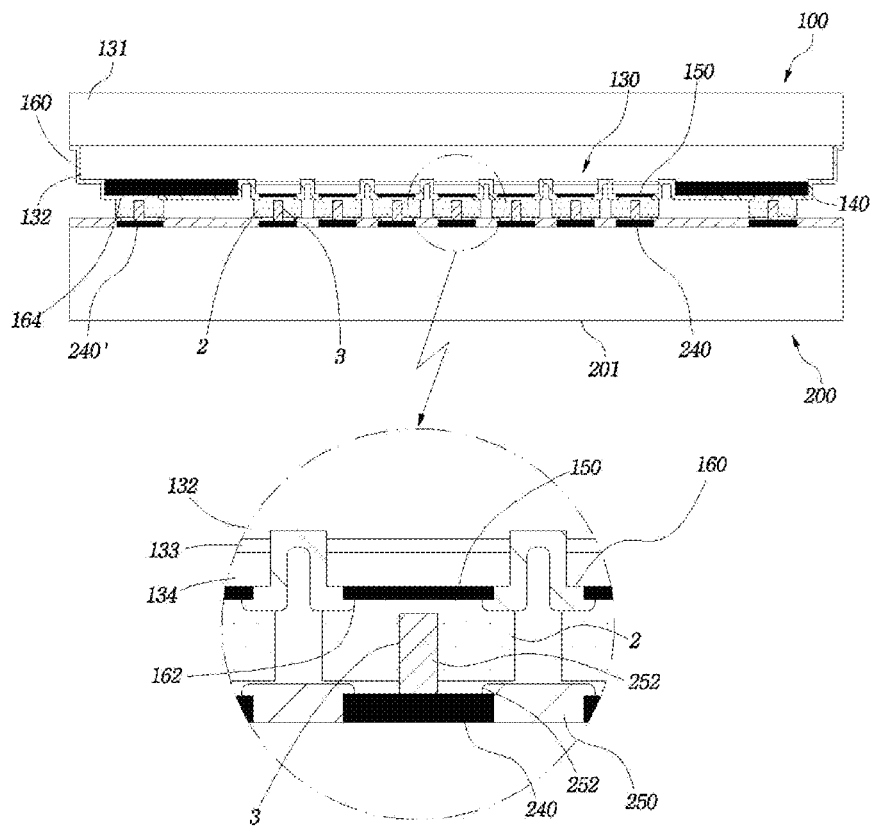
FIG. 10 illustrates a micro-LED module according to a second embodiment of the present invention.

Referring to FIG. 10, a micro-LED module according to a second embodiment of the present invention includes at least one micro-LED 100 including a plurality of LED cells 130 arrayed in a matrix and a submount substrate 200 mounted with the micro-LED 100. The micro-LED module includes a plurality of electrode pads 140 and 150 provided in the micro-LED 100 and pad-type electrodes 240 and 240' formed corresponding to the plurality of electrode pads 140 and 150 in the submount substrate 200. The micro-LED 100 includes connection members through which the electrode pads 140 and 150 are connected to the electrodes 240 and 240' at room temperature without the need to use solders requiring high-temperature melting. Each of the connection members includes a conductive soft block 2 and a conductive insert rod 3 embedded in and electrically connected to the conductive soft block 2 by a vertical force, i.e. a vertical compressive force.

In the micro-LED 100, one n-type semiconductor layer 132 is formed on the primary surface of a sapphire substrate 131 and the LED cells 130 are arrayed in a matrix on the n-type semiconductor layer 132. Each of the plurality of LED cells 130 includes an active layer 133 and a p-type semiconductor layer 134 grown sequentially in one direction from the n-type semiconductor layer 132. Due to this structure, an exposed area of the n-type semiconductor layer is formed at the periphery surrounding the circumferences of the LED cells 130 and trenches are formed between the adjacent LED cells 130 to expose the n-type semiconductor layer 132 therethrough.

The micro-LED 100 includes an electrically insulating cell cover layer 160 covering the plurality of LED cells 130 and the exposed area of the n-type semiconductor layer 132. The cell cover layer 160 includes pad exposure holes 162 and 164 through which the electrode pads 140 and 150 are exposed. The pad exposure holes 162 and 164 include a plurality of first pad exposure holes 162 through which the individual electrode pads 150 of the LED cells 130 are exposed and a second pad exposure hole 164 through which the common electrode pad 140 is exposed.

The submount substrate 200 is preferably an active matrix substrate including a plurality of CMOS cells (not illustrated) corresponding to the plurality of LED cells 130 of the micro-LED 100 and pad-type electrodes 240 and 240' corresponding to the electrode pads of the micro-LED 100. In the submount substrate 200, an electrically insulating electrode cover layer 250 is formed to cover the electrodes 240 and 240' and includes electrode exposure holes 252 through which the electrodes 240 are exposed.

As indicated by alternate long and two short dashes lines in FIG. 10, the electrically insulating cell cover layer 160 covers the LED cell 130 of the micro-LED 100 and includes the pad exposure hole 162 through which the electrode pad 150 is exposed. The conductive soft block 2 is made of a highly electrically conductive and soft material, for example, Au, indium or any suitable solder material, and covers the electrically insulating cell cover layer 160. The conductive soft block 2 is disposed in contact with the electrode pad 150 through the pad exposure hole 162. The conductive soft block 2 is made of a soft material such that the conductive insert rod 3 having a predetermined cross-sectional size can be embedded therein. Preferably, the conductive soft block 2 has a larger thickness than the insertion depth of the conductive insert rod 3 and even the length of the conductive insert rod 3. The conductive soft block 2 may be formed by stacking two or more different materials. One or more layers having specific functions, for example, a layer having the function of increasing the bonding strength between the conductive soft block 2 and the electrode pad 150, may be interposed between the conductive soft block 2 and the electrode pad 150.

The electrically insulating electrode cover layer 250 is formed on the submount substrate 200 to at least cover the electrodes 240 and includes electrode exposure holes 252 through which the electrodes 240 are exposed. The conductive insert rods 3 are made of a material including a high hardness conductive metal, such as Ag, Cu, Al, Ti or Pt, or a material whose strength and conductivity are sufficiently reinforced by carbon materials, such as carbon nanotubes. The conductive insert rods 3 have such a cross-sectional size that they can be embedded in the conductive soft blocks 2. The conductive insert rods 3 are connected to the electrodes 240 through the electrode exposure holes 252 and stand vertically. One or more layers having specific functions, for example, a layer having the function of increasing the bonding strength between the conductive insert rods 3 and the electrodes 240, may be interposed between the electrodes 240 and the conductive insert rods 3.

The conductive soft blocks 2 are free of holes before insertion of the conductive insert rods 3. When the conductive insert rods 3 are embedded in and inserted into the conductive soft blocks 2, the conductive soft blocks 2 are deformed to have holes through which the insertion of the conductive insert rods 3 is permitted. The outer surface of each of the conductive insert rods 3 is in tight contact with the inner surface of the hole formed in the conductive soft block 2 such that the conductive soft block 2 is electrically connected to the conductive insert rod 3. The conductive insert rods 3 may be solid. Alternatively, each of the conductive insert rods 3 may be hollow or have a hook shape at the front end. In this case, the conductive insert rods 3 are more firmly fixed to the conductive soft blocks 2 and the contact surface area of the conductive insert rods 3 with the conductive soft blocks 2 increases. When the hollow conductive insert rods 3 are embedded in the conductive soft blocks 2, portions of the conductive soft blocks 2 enter the cavities of the conductive insert rods 3, and as a result, the volume of the conductive soft blocks 2 does not increase by the volume of the insert rods 3.

Each of the conductive insert rods 3 may be designed such that its cross-sectional size decreases gradually toward the front end. That is, the conductive insert rods 3 may be forwardly tapered, like nails. Due to this shape, the conductive insert rods 3 can be inserted more readily into the conductive soft blocks 2. Alternatively, several conductive insert rods 3 may be provided in one conductive soft block 2 for a larger contact surface area.

The construction of the micro-LED based on the sapphire substrate is followed by the mounting of the micro-LED on the submount substrate.

The construction of the micro-LED and the mounting of the micro-LED on the submount substrate will be explained sequentially below.

Construction of Micro-LED

Figure 11:
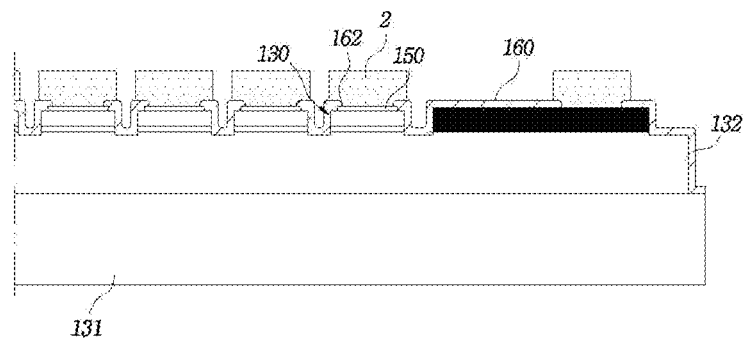
FIG. 11 illustrates a process for forming conductive soft blocks on a micro-LED in a method for fabricating a micro-LED module according to a second embodiment of the present invention.

The micro-LED is constructed in the same manner as in the first embodiment explained with reference to FIGS. 2a to 2e, except that soft blocks are formed, as illustrated in FIG. 11. Preferably, each of the LED cells 130 of the micro-LED 100 constructed by the method illustrated in FIGS. 2a to 2e has a size of 5 µm or less. The size of the p-type electrode pad 150 formed in each LED cell 130 is preferably less than 5 µm.

Referring to FIG. 11, highly electrically conductive and soft conductive soft blocks 2 are formed in contact with the electrode pads 150. The conductive soft blocks 2 cover the electrically insulating cell cover layer 160 and are in contact with the electrode pads 150 through the pad exposure holes 162. The plurality of conductive soft blocks 2 are preferably formed by depositing or placing a soft metal material to cover the cell cover layer 160 and the pad exposure holes 162 and etching the soft metal material such that the soft metal material is connected to the electrode pads 150 through the pad exposure holes 162. As mentioned earlier, the conductive soft blocks 2 are made of a soft material such that the conductive insert rods 3 having a predetermined cross-sectional size can be embedded therein. Preferably, the conductive soft blocks 2 have a thickness larger than the length of the conductive insert rods 3. The conductive soft blocks 2 may be formed by staking two or more different materials. One or more layers having specific functions, for example, a layer having the function of increasing the bonding strength between the conductive soft blocks 2 and the electrode pads 150, may be interposed between the conductive soft blocks 2 and the electrode pads 150.

Preparation of Submount Substrate

The submount substrate is prepared in the manner similar to the process for preparing the submount substrate explained in the first embodiment.

Referring to FIG. 10, the submount substrate 200 is a Si-based substrate having a size of about 15,000 µm×10,000 µm. The submount substrate 200 includes a plurality of CMOS cells corresponding to the plurality of LED cells, a plurality of individual electrodes 240 corresponding to the p-type electrode pads of the micro-LED, and a common electrode 240' corresponding to the n-type electrode pad of the micro-LED. The plurality of electrodes 240 and 240' of the submount substrate 200 are arranged in a matrix on a Si-based substrate material 201 and are connected to the CMOS cells. An electrically insulating electrode cover layer 250 is formed so as to cover the electrodes 240 and 240'. The electrode cover layer 250 has electrode exposure holes 252 through which the individual electrodes 240 are exposed.

The size of the electrodes on the submount substrate 200 and the intervals between the adjacent electrodes do not exceed 5 µm so as to correspond to the size of the LED cells of the micro-LED and the intervals between the adjacent LED cells. If the intervals between the adjacent electrodes exceed 5 µm, the size of the LED cells increases, resulting in a deterioration in the precision of a display including the micro-LED. After the formation of the electrode cover layer 250 having the electrode exposure holes 252 is completed, conductive insert rods 3 are formed. The conductive insert rods 3 are made of a material including a high hardness conductive metal, such as Ag, Cu, Al, Ti or Pt, or a material whose strength and conductivity are sufficiently reinforced by carbon materials, such as carbon nanotubes. The conductive insert rods 3 are connected to the electrodes 240 through the electrode exposure holes 252 and stand vertically.

Mounting

Figure 12:
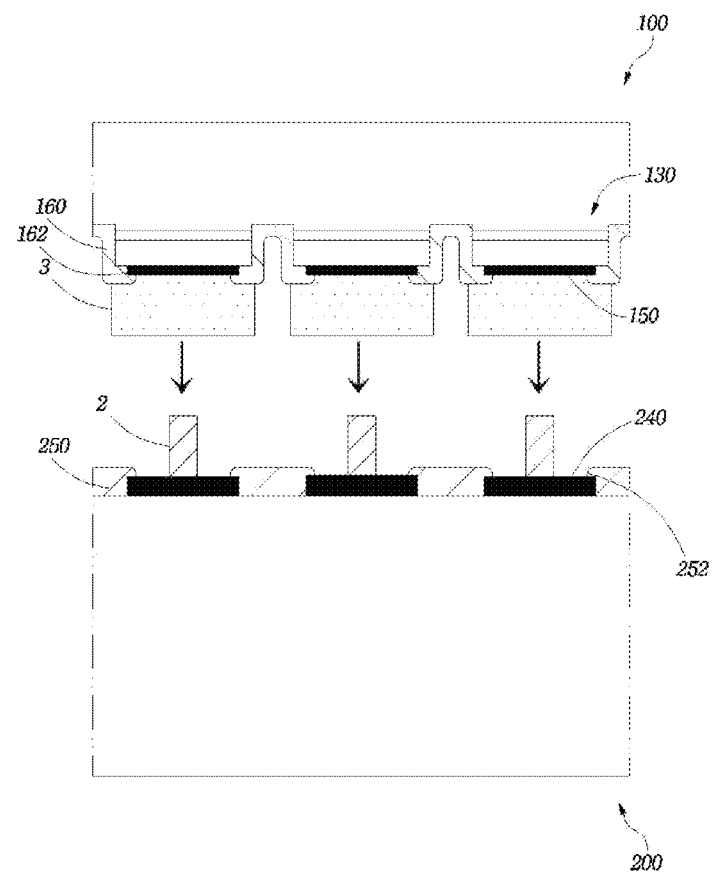
FIG. 12 illustrates a process for mounting a micro-LED on a submount substrate to connect electrode pads of the micro-LED to electrodes of the submount substrate in a method for fabricating a micro-LED module according to a first embodiment of the present invention.

As illustrated in FIG. 12, the micro-LED 100 based on a sapphire substrate 131 is mounted on the submount substrate 200 based on a Si substrate having a coefficient of thermal expansion of 2.6 µmm$^{-1}$K.

As mentioned previously, the plurality of electrodes 240 of the submount substrate 200 are disposed corresponding to the electrode pads 150 of the micro-LED 100. The conductive insert rods 3 are disposed on the plurality of electrodes 240.

First, the micro-LED 100 and the submount substrate 200 are arranged such that the conductive insert rods 3 face the conductive soft blocks 2. Next, the micro-LED 100 and/or the submount substrate 200 are moved in the vertical direction at room temperature to generate a vertical force by which the conductive insert rods 3 are inserted into the conductive soft blocks 2. The conductive insert rods 3 are embedded in the conductive soft blocks 2 to form vertical holes in the conductive soft blocks 2. Inside the vertical holes, the conductive insert rods 3 are in contact with and electrically connected to the conductive soft blocks 2.

Other Examples

Figure 13:
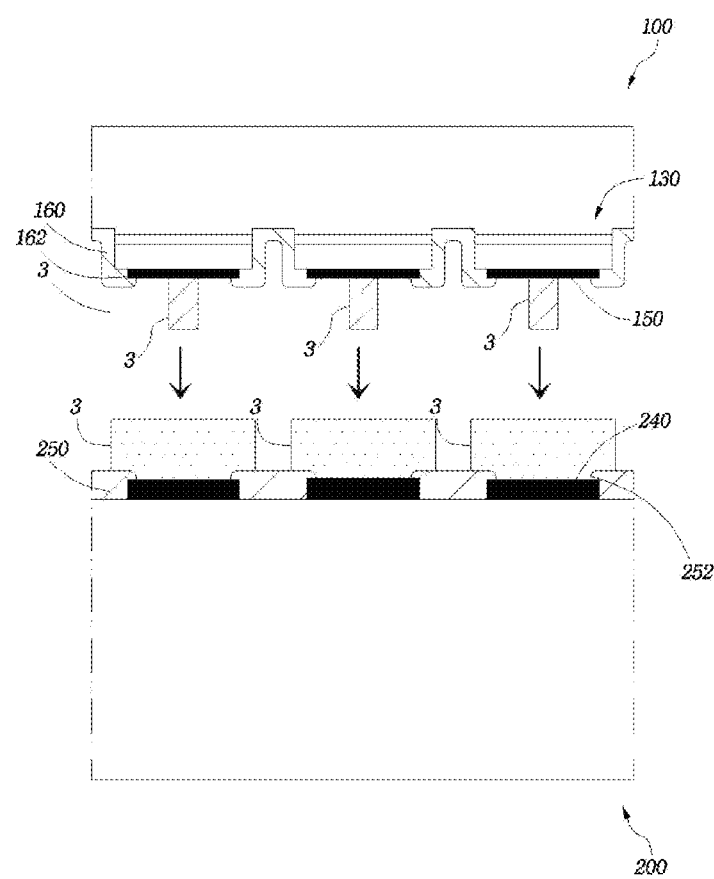
FIGS. 13 and 14a to 14e illustrate modifications of a micro-LED module according to a second embodiment of the present invention.

FIG. 13 illustrates an alternative arrangement of conductive insert rods 3 and conductive soft blocks 2, which is opposite to the previous arrangement. The conductive insert rods 3 are connected to the electrode pads 150 formed on the LED cells 130 and stand vertically. The conductive soft blocks 2 are disposed in contact with the electrodes 240 of the submount substrate 200. The electrode pads 150 are exposed through the pad exposure holes 162 of the cell cover layer 160 covering the LED cells 130. The conductive soft blocks 2 are disposed in contact with the electrode cover layer 250 covering the electrodes 240 and are in contact with the electrodes 240 through the electrode exposure holes 252.

Figure 14A:
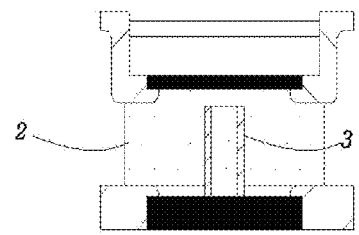
Figure 14B:
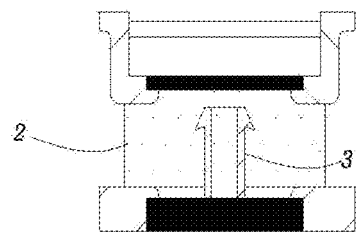
Figure 14C:
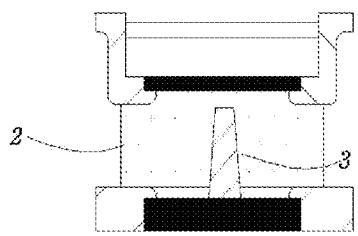
Figure 14D:
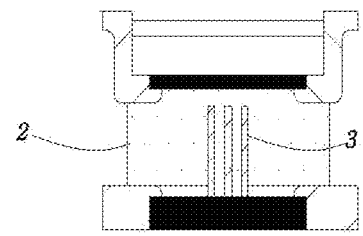
Figure 14E:
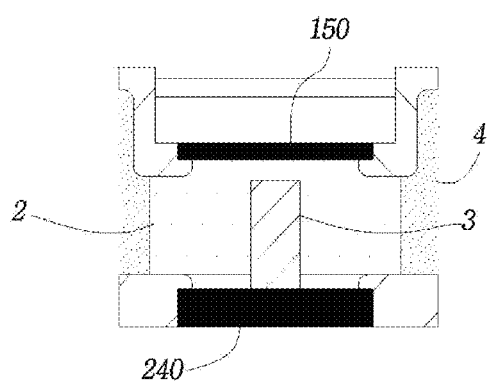

FIGS. 14*a*, 14*b*, 14*c*, 14*d*, and 14*e* illustrate various types of connection members that connect the electrode pads of the micro-LED to the electrodes of the submount substrate at room temperature. FIG. 14*a* illustrates a hollow conductive insert rod 3 inserted into a conductive soft block 2, FIG. 14*b* illustrates a conductive insert rod 3 having a hook shape at the front end and inserted into a conductive soft block 2, FIG. 14*c* illustrates a conductive insert rod 3 gradually tapered toward the front end and inserted into a conductive soft block 2, and FIG. 14*d* illustrates a plurality of conductive insert rods 3 inserted into one conductive soft block 2. In FIG. 14*e*, a reinforcing filling portion 4 is filled between the submount substrate and the micro-LED to ensure a firmer and more reliable connection between the conductive insert rod 3 and the conductive soft block 2.

However, according to a general flip-bonding process for mounting a micro-LED, as the size of solder bumps decreases, the current density and thermal energy density per bump connecting portion increases, resulting in a reduction in the reliability of the flip solder connecting portion. Fine intervals between adjacent solder bumps increase the risk that solder bridging with other adjacent solder bumps may occur upon solder reflow.

The above problem is solved by a flip-bonding technique using Cu pillar bumps. The use of Cu pillar bumps enables much finer flip-bonding without a reduction in the distance between LED cells and an active matrix substrate. Another advantage of flip-bonding is that the electrical and thermal properties of a micro-LED can be improved because the electrical and thermal conductivities of Cu are much higher than those of solder alloys.

Figure 15:
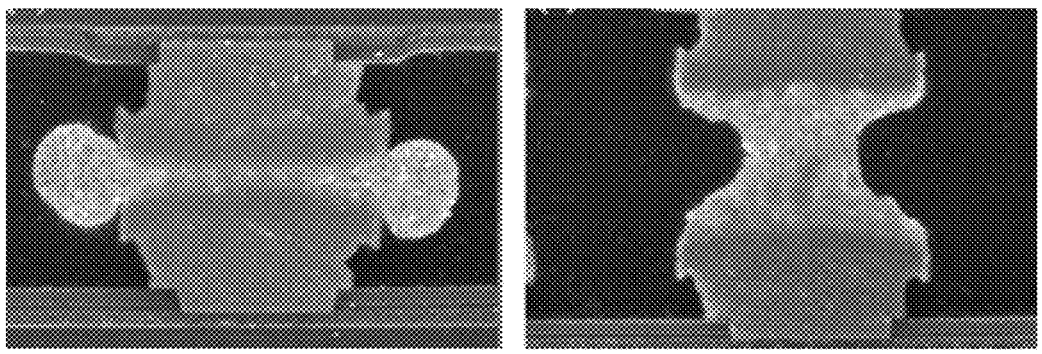
FIG. 15 shows microscopy images showing typical defects in solder bonding portions.

However, this method suffers from difficulty in terms of process control when an under bump metallurgy (UBM) is formed on electrode pads, Cu pillars are formed on the UBM, hemispherical solder caps are formed on the Cu pillars, and electrode pads of LED cells are connected to electrodes of a substrate by bonding involving melting of the solder caps. As illustrated in FIG. 15, when a higher pressure is applied to flip-bond a micro-LED on an active matrix substrate, a solder is squeezed out laterally, causing shorting. Alternatively, when a lower pressure is applied, a narrow neck is formed in the solder bonding portion, increasing the risk that the pads may be disconnected from the electrodes. Further, in the course of leaving only necessary portions and removing unnecessary portions after UBM formation, some residues remain unremoved that increase the risk of bump deformation.

Third Embodiment

According to a general flip-bonding process for mounting a micro-LED, as the size of solder bumps decreases, the current density and thermal energy density per bump connecting portion increases, resulting in a reduction in the reliability of the flip solder connecting portion. Fine intervals between adjacent solder bumps increase the risk that solder bridging with other adjacent solder bumps may occur upon solder reflow.

The above problem is solved by a flip-bonding technique using Cu pillar bumps. The use of Cu pillar bumps enables much finer flip-bonding without a reduction in the distance between LED cells and an active matrix substrate. Another advantage of flip-bonding is that the electrical and thermal properties of a micro-LED can be improved because the electrical and thermal conductivities of Cu are much higher than those of solder alloys.

However, this method suffers from difficulty in terms of process control when an under bump metallurgy (UBM) is formed on electrode pads, Cu pillars are formed on the UBM, hemispherical solder caps are formed on the Cu pillars, and electrode pads of LED cells are connected to electrodes of a substrate by bonding involving melting of the solder caps. As illustrated in FIG. 15, when a higher pressure is applied to flip-bond a micro-LED on an active matrix substrate, a solder is squeezed out laterally, causing shorting. Alternatively, when a lower pressure is applied, a narrow neck is formed in the solder bonding portion, increasing the risk that the pads may be disconnected from the electrodes. Further, in the course of leaving only necessary portions and removing unnecessary portions after UBM formation, some residues remain unremoved that increase the risk of bump deformation.

Accordingly, there is a need for a method that can prevent solder bonding portions from forming excessively narrow necks or swelling, which is a cause of open or short connection, when a micro-LED is flip-bonded to an active matrix substrate through solder bonding portions formed using Cu pillar bumps including Cu pillars and solder caps formed at the ends of the Cu pillars.

A third embodiment of the present invention provides a method that can prevent solder bonding portions from forming excessively narrow necks or swelling when a micro-LED is mounted on an active matrix substrate.

Figure 16:
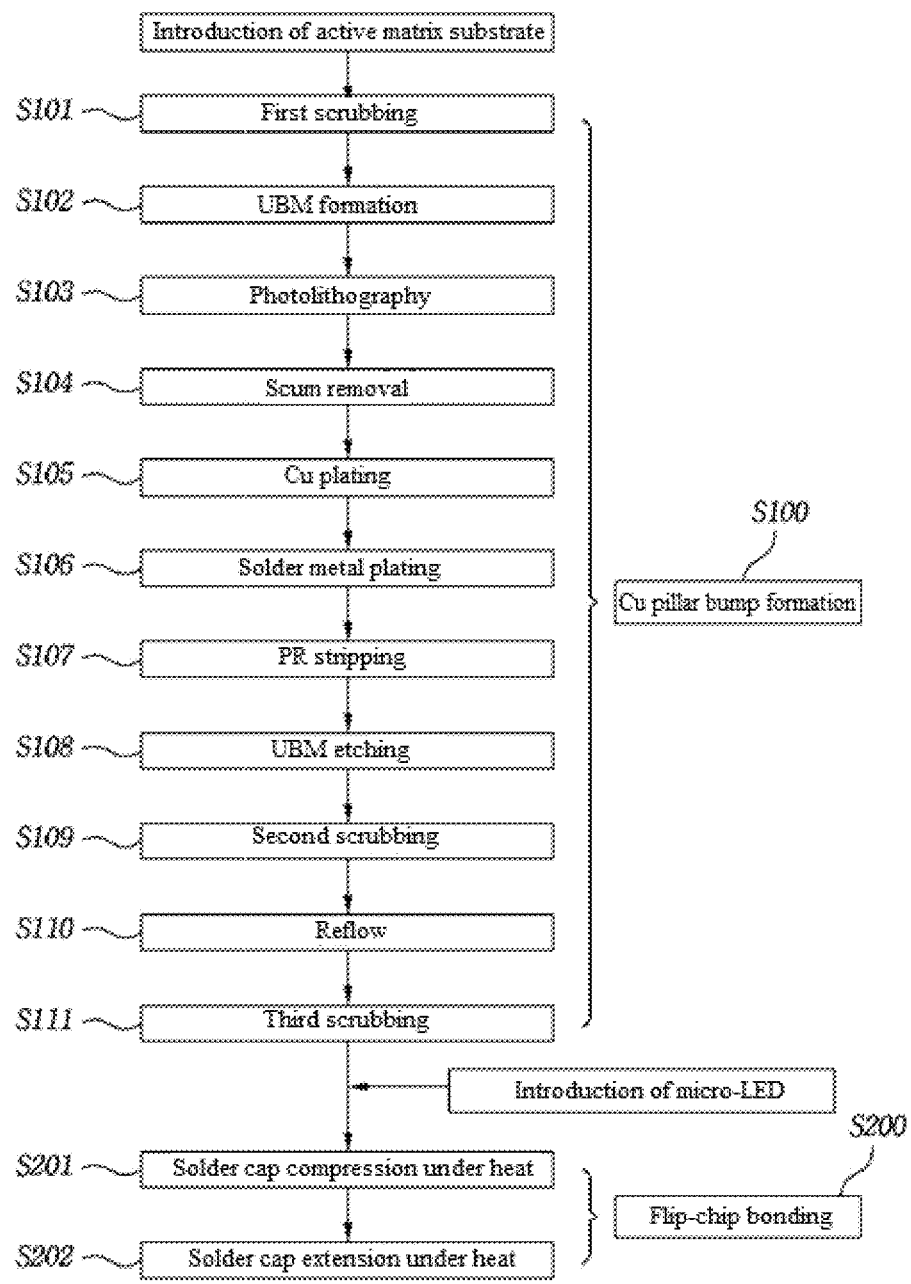
FIG. 16 illustrates a flow chart for explaining a method for flip-bonding a micro-LED according to a third embodiment of the present invention.

The method is illustrated in FIG. 16. As illustrated in FIG. 16, the method essentially includes forming a plurality of Cu pillar bumps on an active matrix substrate (S100) and flip-bonding a micro-LED including LED cells corresponding to the plurality of Cu pillar bumps to the active matrix substrate through the plurality of Cu pillar bumps (S200).

—Provision of Active Matrix Substrate and Micro-LED—

An active matrix substrate having a size of about 15,000 μm×10,000 μm and a micro-LED to be mounted on the active matrix substrate are provided before the formation of pillar bumps.

Figure 17:
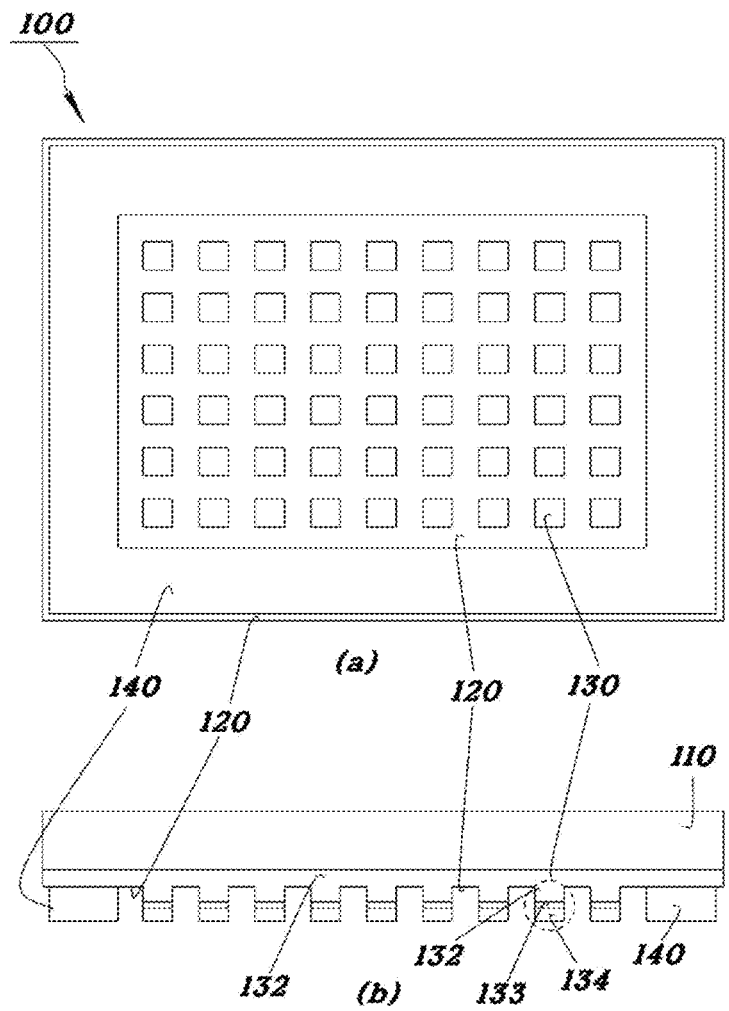
FIG. 17 is a conceptual view for explaining a micro-LED of a micro-LED module according to a third embodiment of the present invention.

The micro-LED 100 includes a plurality of LED cells 130 arrayed in a matrix, as illustrated in FIG. 17. Each of the plurality of LED cells 130 includes an n-type semiconductor layer 132, an active layer 133, and a p-type semiconductor layer 134 formed in this order on a light-transmitting growth substrate 100. A p-type electrode pad (not illustrated) is formed on the p-type semiconductor layer 134 of each LED cell 130.

An exposed area of the n-type semiconductor layer 132 is formed in the shape of a quadrangular ring along the peripheral edge of the micro-LED. At least one n-type electrode pad 140 may be formed in the exposed area. The n-type electrode pad 140 is a common electrode connected to the n-type semiconductor layers 132 of the LED cells 130.

The active matrix substrate includes a plurality of CMOS cells corresponding to the plurality of LED cells 130 of the micro-LED 100, a plurality of individual electrode pads corresponding to the p-type electrode pads of the micro-LED 100, and a common electrode pad corresponding to the n-type electrode pad.

Figure 18:
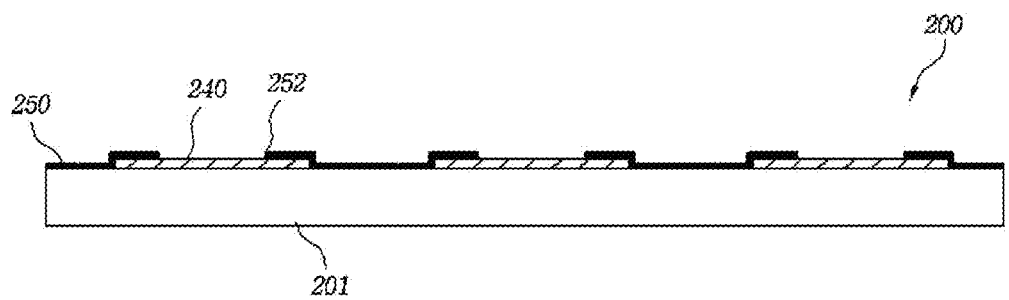
FIG. 18 is a partial cross-sectional view of an active matrix substrate of a micro-LED module according to a third embodiment of the present invention.

FIG. 18 is a partial enlarged view of the active matrix substrate. Referring to FIG. 18, the active matrix substrate 200 includes a plurality of individual electrode pads 240 arrayed in a matrix on a Si substrate material 201 and connected to CMOS cells and an insulating layer 250 formed to cover the individual electrode pads 240. The insulating layer 250 has openings 252 through which the individual electrode pads 240 are exposed.

—Formation of Pillar Bumps (S100)—

Figure 19:
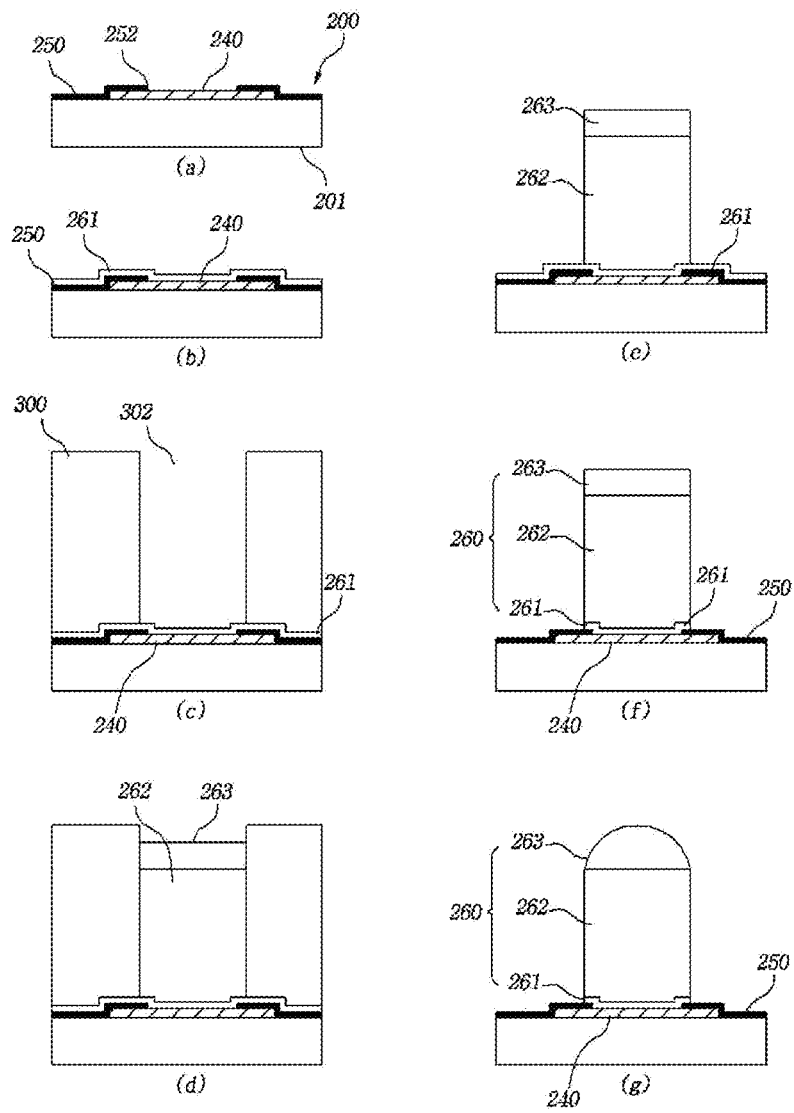
FIG. 19 illustrates the formation of a Cu pillar bump in a flip-bonding method according to a third embodiment of the present invention.

Referring to FIGS. 16 and 19, S100 includes first scrubbing (S101), under bump metallurgy (UBM) formation (S102), photolithography (S103), scum removal (S104), Cu plating (S105), solder metal plating (S106), PR stripping (S107), UBM etching (S108), second scrubbing (S109), reflow (S110), and third scrubbing (S111).

In S101, a submount substrate 200 is scrubbed with a scrubber, as illustrated in (a) of FIG. 19. In the submount substrate 200, an electrode 240 made of an Al or Cu material is formed on a substrate material 201 including CMOS cells and an insulating layer 250 having an opening 252 is formed on the substrate material 201. The CMOS cells are formed by a CMOS process and one area of the electrode pad 240 is exposed through the opening 252.

In S102, a UBM 261 is formed on the active matrix substrate 200 to cover the insulating layer 250 and the electrode pad 240, as illustrated in (b) of FIG. 19. The UBM 261 serves to increase the adhesion of the electrode pad 240 to a Cu pillar and to prevent a solder from diffusing. The UBM 261 may have a layered structure of Ti/Cu and may be formed by sputtering the corresponding metals.

In S103, a photoresist (PR) 300 is formed over the entire area of the UBM 261 on the active matrix substrate 200, as illustrated in (c) of FIG. 19. Thereafter, a mask pattern (not illustrated) is placed on the photoresist and light is applied to form an opening 302 through which only one area of the UBM 261 formed directly on the electrode pad 240 is exposed. Next, scum formed during the photolithography is removed (S104).

Next, Cu is plated through the opening 302 of the PR 300 to form a Cu pillar 262 (S105) and then SnAg as a solder metal is plated on the Cu pillar 262 to form a SnAg solder cap 263 in the form of a layer with a predetermined thickness (S106), as illustrated in (d) of FIG. 194. It is noted herein that Cu may be Cu metal or its alloy.

Next, the PR is stripped (S107). As a result, the upper and side surfaces of a solder bump including the Cu pillar 262 and the solder cap 263 are exposed, as illustrated in (e) of FIG. 19.

Next, UBM etching is performed (S108) such that only the portion of the UBM 261 located directly under the Cu pillar 262 remains unremoved and the other portions of the UBM 261 are removed by etching, as illustrated in (f) of FIG. 19. Then, second scrubbing is carried out to remove residue (S109). After the UBM etching (S109), the resulting Cu pillar bump 260 has a structure in which the Cu pillar 262 and the solder cap 263 are sequentially stacked on the UBM 261 formed on the electrode pad 240 of the active matrix substrate 200. Next, reflow is performed (S110). As a result, the solder cap 263 in the form of a layer is melted and cured to form a hemisphere. Alternatively, the solder cap 263 may have a shape whose cross-section is semicircular. Rapid thermal processing (RTP) is suitable for this reflow. Next, third scrubbing is performed to remove residue (S111).

Figure 20:
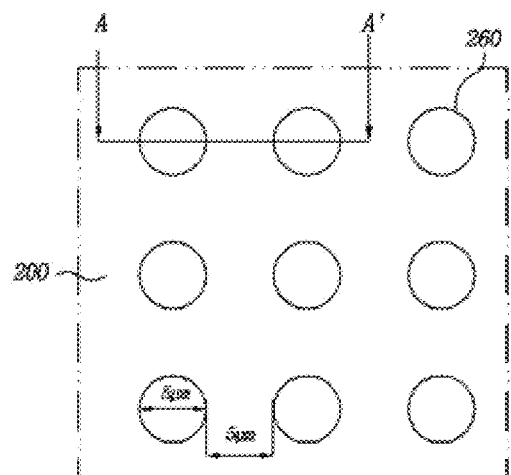
FIG. 20 illustrates an active matrix substrate provided with Cu pillar bumps.
Figure 20:
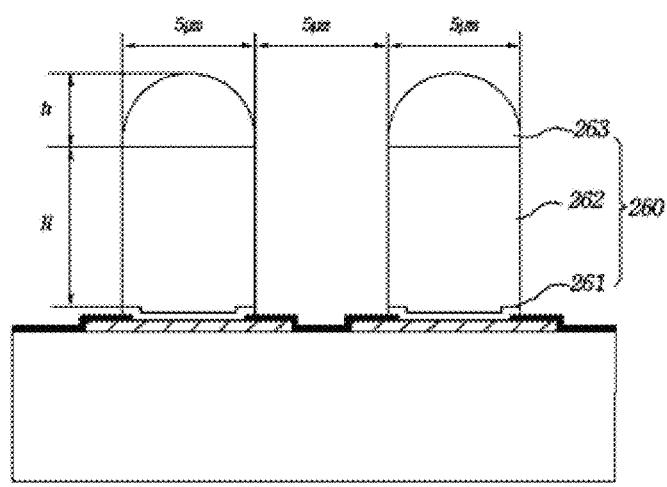

The plurality of Cu pillar bumps 260 are spaced a distance of 5 μm from adjacent ones in the widthwise and lengthwise directions and are arrayed in a matrix on the active matrix substrate 200, as illustrated in (a) and (b) of FIG. 20. Taking into consideration the possibility that solders reach the surface of the active matrix substrate 200 when the hemispherical solder caps 263 are compressed during flip-bonding, the height H of the Cu pillars 262 is preferably at least 1.5 times, more preferably at least 2 times larger than the height h of the solder caps 263.

It is preferred that the intervals between the Cu pillar bumps 260 on the active matrix substrate and the intervals between the LED cells are substantially the same as the diameter of the Cu pillars. It is desirable that the interval between the adjacent Cu pillar bumps does not exceed 5 μm. If the interval exceeds 5 μm, the diameter of the Cu pillar bumps and the size of the LED cells corresponding thereto increase, resulting in a deterioration in the precision of a display including the micro-LED.

The active matrix substrate has a size of 15,000 μm×10,000 μm and approximately 1,000,000 Cu pillar bumps are formed thereon. Approximately 1,000,000 LED cells corresponding to the Cu pillar bumps are provided in the micro-LED. During subsequent flip-bonding, p-type electrode pads of about 1,000,000 LED cells are bonded to about 1,000,000 Cu pillar bumps. In the case where the heights of the LED cells after bonding are different, brightness variations may be caused due to the difference in the height of the active layers of the LED cells even when the same current is supplied. Accordingly, it is necessary to make the solder bonding portions regular in shape after flip-bonding so that the difference in height between the LED cells becomes constant.

—Flip-Bonding (S200)—

Figure 21:
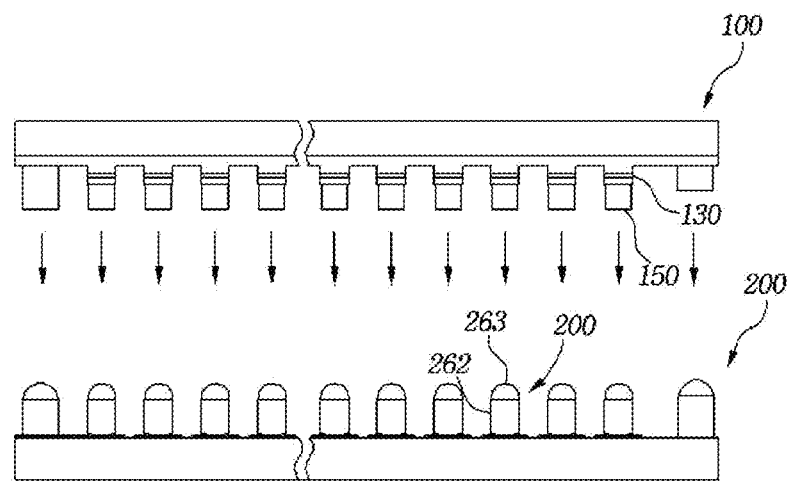
FIG. 21 illustrates a state before mounting of a micro-LED on an active matrix substrate by flip-bonding according to a third embodiment of the present invention.

Referring to FIG. 21, each of the LED cells 130 of the micro-LED 100 prepared before flip-bonding (S200) includes p-type electrode pads 150. The p-type electrode pads 150 may be or include Cu pillars. The number and positions of the p-type electrode pads 150 in the micro-LED 100 correspond to those of the Cu pillar bumps 260 of the active matrix substrate 200. For flip-bonding (S200), the Cu pillar bumps 260 of the active matrix substrate 200 are arranged to face the p-type electrode pads 150 of the micro-LED 100. S200 includes compressing solders at a specific temperature where the solder caps 263 are semi-melted (S201) and extending the solders (S202).

As a result of the solder compression S201 and the solder extension S202, portions of the solders adjacent to the micro-LED (i.e. first portions) and portions of the solders adjacent to the active matrix substrate (i.e. second portions) are less dense in texture than the other portions of the solders. The intermediate portions (i.e. third portions) between the first portions and the second portions are in the form of bottle necks whose cross section is slightly smaller than the neighboring portions. The third portions would be more dilute in texture than the other portions of the solders. Assuming that solder bonding portions are formed only by compressing the solder caps, the solder portions become dense as a whole. In contrast, according to the present invention, the solders are continuously compressed and extended to form bottle necks whose texture becomes dilute when a tensile force is applied in both directions.

Figure 22:
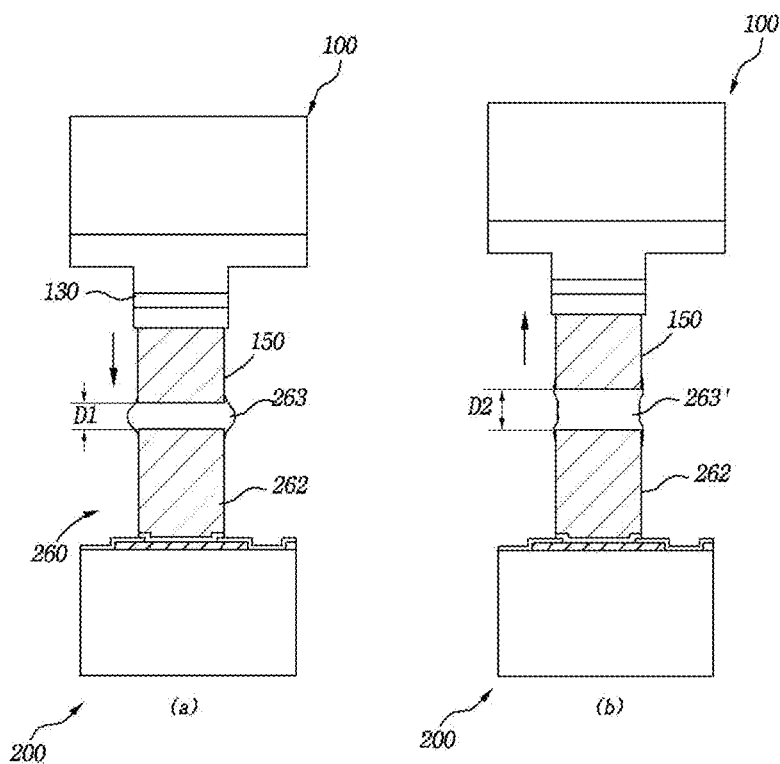
FIG. 22 illustrates compression and extension for flip-bonding according to a third embodiment of the present invention.

In the solder compression S201 illustrated in (a) of FIG. 22, the interval between the Cu pillar 262 of the Cu pillar bump 260 of the submount substrate 200 and the electrode pad 150 of the micro-LED 100 is reduced to a first distance D1 at a temperature where the SnAg solder cap 263 of the Cu pillar bump 260 of the active matrix substrate 200 is semi-melted. That is, the solder cap 263 in a semi-molten state is compressed. At this time, it is preferred to sufficiently compress the solder cap 263 such that the first distance D1 is reduced to half of the height of the solder cap 263, allowing sufficient spreading of the solder cap in the lateral direction. If the solder cap 263 is not sufficiently spread by compression, it may be biased in one direction when stretched by subsequent extension.

In the subsequent extension S202, the interval between the Cu pillar 262 of the Cu pillar bump 260 of the submount substrate 200 and the electrode pad 150 of the micro-LED 100 is increased to the second distance D2 from the first distance D1, allowing extension of the solder cap 263 in a semi-molten state. The second interval D2 is adjusted to be larger than half of the height of the solder cap 263.

As described previously, when the solder cap 263 in a semi-molten state is compressed until it protrudes laterally, extended, and coagulated, the resulting solder bonding portion does not protrude laterally and is substantially free of a narrow neck. Due to this shape, the solder bonding portion can firmly fix the Cu pillar 262 and the electrode pad 150.

Finally, the maximum cross-sectional diameter of the solder bonding portion 263' is preferably larger than the diameter of the Cu pillar 262 and the minimum cross-sectional diameter of the solder bonding portion 263' is preferably larger by 80-100% than the diameter of the Cu pillars 262. The minimum cross-sectional diameter portion is located at the midpoint of the height of the solder bonding portion 263'. The maximum cross-sectional diameter portion is in contact with the side surface of the end portion of the Cu pillar 262 or the electrode pad 150. The maximum cross-sectional diameter portion of the solder bonding portion 263' is formed as a result of compression and extension of the solder cap 263 in a semi-molten state and surrounds the side surface of the end portion of the Cu pillar 262 or the electrode pad 150, enabling more reliable solder bonding.

What is claimed is:

1. A micro-LED module comprising:
   a micro-LED comprising a plurality of LED cells, each of which comprises a first conductive semiconductor layer, an active layer, and a second conductive semiconductor layer;
   a submount substrate electrically connected to the micro-LED;
   a plurality of electrode pads formed on the micro-LED;
   a plurality of electrodes formed on the submount substrate to correspond to the plurality of electrode pads;
   a plurality of connection members through which the plurality of electrode pads are connected to the corresponding plurality of electrodes;
   a gap fill layer formed in a gap between the micro-LED and the submount substrate and having a bonding strength to the micro-LED and the submount substrate; and
   a cell cover layer formed to cover exposed areas of the first conductive semiconductor layer and edge portions of the plurality of electrode pads and including pad exposure holes through which portions of each of the plurality of electrode pads are exposed,
   wherein each of the plurality of exposed electrode pads is depressed to a predetermined depth from the surface of the cell cover layer, and
   wherein the plurality of LED cells are arrayed in a matrix inside the micro-LED and an exposed area of the first conductive semiconductor layer is formed outside the micro-LED.

2. The micro-LED module according to claim 1, wherein the gap fill layer is formed between the micro-LED and the submount substrate to completely surround the plurality of connection members.

3. The micro-LED module according to claim 1, wherein the gap fill layer is formed by filling a gap filling material in the form of a liquid or gel between the micro-LED and the submount substrate and curing the gap filling material.

4. The micro-LED module according to claim 1, wherein the gap fill layer is formed by filling a gap filling material in the form of a powder between the micro-LED and the submount substrate, melting the gap filling material, and curing the molten gap filling material.

5. The micro-LED module according to claim 1, wherein the plurality of electrode pads comprise:
   a plurality of individual electrode pads connected to the second conductive semiconductor layers of the plurality of LED cells and arrayed in a matrix; and
   a peripheral common electrode pad connected to the first conductive semiconductor layer in the exposed area of the first conductive semiconductor layer,
   wherein the plurality of electrodes comprise a plurality of first electrodes connected to the plurality of individual electrode pads and a second electrode connected to the common electrode pad, and
   wherein the plurality of connection members comprise:
   a plurality of inner connection members through which the plurality of individual electrode pads are connected to the plurality of first electrodes; and
   a peripheral connection member through which the common electrode pad is connected to the second electrode.

6. The micro-LED module according to claim 5, wherein the gap fill layer comprises:
   an inner filling portion occupying an inner area between the micro-LED and the submount substrate and surrounding the plurality of inner connection members; and
   a peripheral filling portion occupying an outer area between the micro-LED and the submount substrate and surrounding the peripheral connection member.

7. The micro-LED module according to claim 6, wherein the gap fill layer further comprises a circumferential portion covering the peripheral sides of the micro-LED on a peripheral empty area of the submount substrate.

8. The micro-LED module according to claim 1, wherein each of the plurality of connection members comprises a metal pillar connected to one of the electrode pads and the electrodes and a solder formed on the metal pillar.

9. The micro-LED module according to claim 1, wherein the gap fill layer comprises:
   an inner filling portion occupying an inner area between the micro-LED and the submount substrate where the plurality of micro-LED cells exist; and
   a peripheral filling portion occupying a peripheral area between the micro-LED and the submount substrate where none of the plurality of micro-LED cells exist.

10. The micro-LED module according to claim 1, wherein the gap fill layer comprises a filling portion occupying an area between the micro-LED and the submount substrate and a circumferential portion covering the peripheral sides of the micro-LED on a peripheral empty area of the submount substrate.

11. A micro-LED module comprising:
a micro-LED comprising a plurality of LED cells, each of which comprises a first conductive semiconductor layer, an active layer, and a second conductive semiconductor layer;
a submount substrate electrically connected to the micro-LED;
a plurality of electrode pads formed on the micro-LED and comprising a peripheral common electrode pad connected to the first conductive semiconductor layer in an exposed area of the first conductive semiconductor layer;
a plurality of electrodes formed on the submount substrate corresponding to the plurality of electrode pads;
a plurality of connection members through which the plurality of electrode pads are connected to the corresponding plurality of electrodes;
a gap fill layer formed in a gap between the micro-LED and the submount substrate and having a bonding strength to the micro-LED and the submount substrate; and
a cell cover layer formed to cover exposed areas of the first conductive semiconductor layer and edge portions of the plurality of electrode pads and including pad exposure holes through which portions of each of the plurality of electrode pads are exposed,
wherein the peripheral common electrode pad is in contact with the first semiconductor layer and not in contact with the second conductive layer and the active layer by the cell cover layer.

12. The micro-LED module according to claim 11, wherein the gap fill layer is formed between the micro-LED and the submount substrate to completely surround the plurality of connection members.

13. The micro-LED module according to claim 11, wherein the gap fill layer is formed by filling a gap filling material in the form of a liquid or gel between the micro-LED and the submount substrate and curing the gap filling material.

14. The micro-LED module according to claim 11, wherein the gap fill layer is formed by filling a gap filling material in the form of a powder between the micro-LED and the submount substrate, melting the gap filling material, and curing the molten gap filling material.

15. The micro-LED module according to claim 11, wherein the plurality of LED cells are arrayed in a matrix inside the micro-LED and the exposed area of the first conductive semiconductor layer is formed outside the micro-LED.

16. The micro-LED module according to claim 15, wherein the plurality of electrode pads comprise a plurality of individual electrode pads connected to the second conductive semiconductor layers of the plurality of LED cells and arrayed in a matrix,
wherein the plurality of electrodes comprise a plurality of first electrodes connected to the plurality of individual electrode pads and a second electrode connected to the common electrode pad, and
wherein the plurality of connection members comprise:
a plurality of inner connection members through which the plurality of individual electrode pads are connected to the plurality of first electrodes; and
a peripheral connection member through which the common electrode pad is connected to the second electrode.

17. The micro-LED module according to claim 16, wherein the gap fill layer comprises:
an inner filling portion occupying an inner area between the micro-LED and the submount substrate and surrounding the plurality of inner connection members; and
a peripheral filling portion occupying an outer area between the micro-LED and the submount substrate and surrounding the peripheral connection member.

18. The micro-LED module according to claim 17, wherein the gap fill layer further comprises a circumferential portion covering the peripheral sides of the micro-LED on a peripheral empty area of the submount substrate.

19. The micro-LED module according to claim 11, wherein each of the plurality of connection members comprises a metal pillar connected to one of the electrode pads and the electrodes and a solder formed on the metal pillar.

* * * * *